United States Patent
Hayasaka et al.

(10) Patent No.: US 10,606,499 B2
(45) Date of Patent: Mar. 31, 2020

(54) COMPUTER SYSTEM, STORAGE APPARATUS, AND METHOD OF MANAGING DATA

(71) Applicant: HITACHI, LTD., Tokyo (JP)

(72) Inventors: Mitsuo Hayasaka, Tokyo (JP); Keiichi Matsuzawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 209 days.

(21) Appl. No.: 15/755,317

(22) PCT Filed: Sep. 11, 2015

(86) PCT No.: PCT/JP2015/075917
§ 371 (c)(1),
(2) Date: Feb. 26, 2018

(87) PCT Pub. No.: WO2017/042978
PCT Pub. Date: Mar. 16, 2017

(65) Prior Publication Data
US 2018/0253251 A1 Sep. 6, 2018

(51) Int. Cl.
G06F 16/00 (2019.01)
G06F 3/06 (2006.01)
H03M 7/30 (2006.01)

(52) U.S. Cl.
CPC ............ G06F 3/0641 (2013.01); G06F 3/067 (2013.01); G06F 3/0608 (2013.01); H03M 7/30 (2013.01); H03M 7/3091 (2013.01)

(58) Field of Classification Search
CPC ...... G06F 3/0641; G06F 3/0608; G06F 3/067; G06F 16/1748; G06F 16/215; H03M 7/30; H03M 7/3091
See application file for complete search history.

(56) References Cited

U.S. PATENT DOCUMENTS 5,990,810 A 11/1999 Williams
9,152,333 B1 * 10/2015 Johnston ............... G06F 3/0641
(Continued)

FOREIGN PATENT DOCUMENTS

JP 2011-175421 A 9/2011
JP 2014-514620 A 6/2014

OTHER PUBLICATIONS

International Search Report for WO 2017/042978 A1, dated Dec. 1, 2015.

Primary Examiner — Noosha Arjomandi
(74) Attorney, Agent, or Firm — Volpe and Koenig, P.C.

(57) ABSTRACT

It is provided a computer system comprising at least one storage apparatus and a computer, wherein the each of the at least one storage apparatus is configured to manage identification information indicating specifics of the stored data, and wherein the computer determines whether the data to be written to the one of the at least one storage apparatus has duplicate data, which is the same data already stored in any one of the at least one storage apparatus, transmits deduplicated data, and uses at least one of individual pieces of identification information or a range of pieces of identification information, depending on how many pieces of identification information appear in succession, to request the information indicating whether the data that is associated with the calculated identification information is stored from the one of the at least one storage apparatus.

15 Claims, 15 Drawing Sheets

(56) References Cited

U.S. PATENT DOCUMENTS

| | | | |
|---|---|---|---|
| 10,067,969 B2* | 9/2018 | Rice | G06F 16/2282 |
| 10,416,928 B2* | 9/2019 | Aston | G06F 3/067 |
| 2008/0140947 A1* | 6/2008 | Slik | G06F 3/0605 |
| | | | 711/154 |
| 2009/0271412 A1* | 10/2009 | Lacapra | H04L 67/104 |
| 2010/0031086 A1* | 2/2010 | Leppard | G06F 11/1662 |
| | | | 714/15 |
| 2010/0169280 A1* | 7/2010 | Shi | H04L 67/104 |
| | | | 707/640 |
| 2013/0046733 A1 | 2/2013 | Sakuraba et al. | |
| 2013/0226888 A1* | 8/2013 | Govind | G06F 16/172 |
| | | | 707/698 |
| 2015/0154221 A1* | 6/2015 | Shin | G06F 16/1752 |
| | | | 707/692 |
| 2017/0206135 A1* | 7/2017 | Zeng | G06F 3/064 |
| 2017/0262307 A1* | 9/2017 | Venkatesh | G06F 16/1794 |
| 2017/0277556 A1* | 9/2017 | Ishii | G06F 9/46 |
| 2017/0364701 A1* | 12/2017 | Struttmann | G06F 21/78 |
| 2018/0113804 A1* | 4/2018 | Hsu | G06F 3/0608 |
| 2018/0364949 A1* | 12/2018 | Aston | G06F 3/0661 |

\* cited by examiner

| TYPE INFORMATION | TYPE | PROCESSING SPECIFICS | | | | | |
|---|---|---|---|---|---|---|---|
| | | COMPRESSION APPLICATION SIZE | DECOMPRESSION | DEDUPLICATION UNIT | HEADER | METADATA | BODY | TRAILER |
| 'A' | A | - | - | - | - | | | |
| 'B' | B | - | NO | BBB KB (FILE) | DEDUPLICATION | | | |
| 'C' | C | CC MB | YES | CCC KB (FIXED LENGTH) | COMPRESSION | COMPRESSION | DEDUPLICATION AND COMPRESSION | DEDUPLICATION AND COMPRESSION |
| 'D' | D | DD MB | YES | DDD KB (VARIABLE LENGTH) | COMPRESSION | | | |
| OTHER | O | ZZ MB | NO | - | COMPRESSION | | | |

CONTENT PROCESSING INFORMATION TABLE

*Fig. 3A*

| OFFSET (T61) | SIZE (T62) | STORAGE DESTINATION COMPRESSION UNIT NUMBER (T63) | INTRA-STORAGE DESTINATION COMPRESSION UNIT OFFSET (T64) | DEDUPLICATION DESTINATION (FILE NAME: OFFSET) (T65) |
|---|---|---|---|---|
| 0 | 100B | - | - | UNIQUE ID/CONTENT X |
| 100 | 50B | 2 | 0 | - |
| 150 | 100B | 4 | 102 | - |
| 250 | 50B | 3 | 50 | - |
| 300 | 4K | 1 | 200 | - |

T40, T11, T21, T31

| COMPRESSION UNIT NUMBER (T70) | POST-COMPRESSION APPLICATION DATA OFFSET (T71) | APPLIED COMPRESSION TYPE (T72) | PRE-COMPRESSION SIZE (T73) | POST-COMPRESSION SIZE (T74) |
|---|---|---|---|---|
| 1 | 0 | a | 4KB | 1KB |
| 2 | 30 | b | 50B | 20B |
| 3 | 70 | c | 50B | 30B |
| 4 | 100 | NONE | 500B | 100B |

CONTENT MANAGEMENT TABLE

*Fig. 3B*

COMPUTER SYSTEM, STORAGE APPARATUS, AND METHOD OF MANAGING DATA

BACKGROUND OF THE INVENTION

This invention relates to a storage apparatus.

There are cases where an amount of data is reduced for its storage in order to decrease a cost of a medium for storing the data. For example, file compression contracts data segments having the same content in one file, to thereby reduce the data amount. Deduplication contracts data segments having the same content not only in one file but also among files, to thereby reduce an amount of data in a file system and a storage apparatus.

In the following description, a data segment that is the unit of deduplication processing is referred to as "chunk". Logically cohesive data that is the unit of storage in a storage device is referred to as "content". Content can be a normal file, a file in which normal files are assembled, for example, an archive file, a backup file, a virtual file, or a volume file, a part of a file, or a part of a volume.

The background art of the technology of this invention includes U.S. Pat. No. 5,990,810 A. In U.S. Pat. No. 5,990,810 A, there is disclosed a method of efficiently storing data by executing duplication determination in a case where content is to be stored in a storage apparatus from a host computer over a network to determine, for each chunk, whether the chunk is already stored in the storage apparatus, and then transmitting only chunks that are not stored yet to reduce the amount of data transferred.

SUMMARY OF THE INVENTION

Whether a chunk is a duplicate can be determined by a method in which the determination is conducted on the host computer and a method in which the determination is conducted on the storage apparatus.

In the method disclosed in U.S. Pat. No. 5,990,810 A, for example, duplication determination is conducted on the storage apparatus, and the host computer obtains the result of the duplication determination from the storage apparatus to transmit only new chunks to the storage apparatus.

However, in the deduplication processing method of U.S. Pat. No. 5,990,810 A, an inquiry is made to the storage apparatus for the duplication determination of every chunk. This means that the host computer transmits information required for the duplication determination to the storage apparatus, and receives the result of the duplication determination from the storage apparatus. The method of U.S. Pat. No. 5,990,810 A is accordingly lower in performance by one round-trip data communication than the method in which duplication is determined on the host computer.

In addition, an increase in the number of host computers increases processing load on the storage apparatus side, with the result that system performance drops.

It is therefore an object of this invention to provide a computer system in which a host computer and a storage apparatus cooperate with each other to execute efficient deduplication processing. For example, a storage system is provided in which deduplication processing is executed efficiently by transmitting from a storage apparatus to a host computer only minimum information required to conduct deduplication determination on the host computer side.

The representative one of inventions disclosed in this application is outlined as follows. There is provided a computer system, which has a deduplication function, the computer system comprising: at least one storage apparatus each having a storage device in which data is stored; and a computer configured to request each of the at least one storage apparatus to write data.

The each of the at least one storage apparatus is configured to manage identification information indicating specifics of the stored data. The computer is configured to: calculate identification information indicating specifics of data to be written to one of the at least one storage apparatus; request information indicating whether data that is associated with the calculated identification information is stored to the one of the at least one storage apparatus to obtain the information indicating whether the data that is associated with the calculated identification information is stored; use the obtained information to determine whether the data to be written to the one of the at least one storage apparatus has duplicate data, which is the same data already stored in any one of the at least one storage apparatus; and transmit deduplicated data, which no longer has the duplicate data, to the one of the at least one storage apparatus, and request that the transmitted data be written. The one of the at least one storage apparatus is configured to store the data requested by the computer to be written. The computer is configured to use at least one of individual pieces of identification information or a range of pieces of identification information, depending on how many pieces of identification information appear in succession, to request the information indicating whether the data that is associated with the calculated identification information is stored from the one of the at least one storage apparatus.

According to the one embodiment of this invention, efficient data deduplication processing can be executed. Problems, configurations, and effects other than those described above are revealed in the following description of embodiments of this invention.

BRIEF DESCRIPTION OF THE DRAWINGS

FIG. 3A is a diagram for illustrating an example of a configuration of a content processing information table according to the first embodiment.

FIG. 3B is a diagram for illustrating an example of a configuration of a content management table according to the first embodiment.

DETAILED DESCRIPTION OF THE PREFERRED EMBODIMENTS

Figure 1:
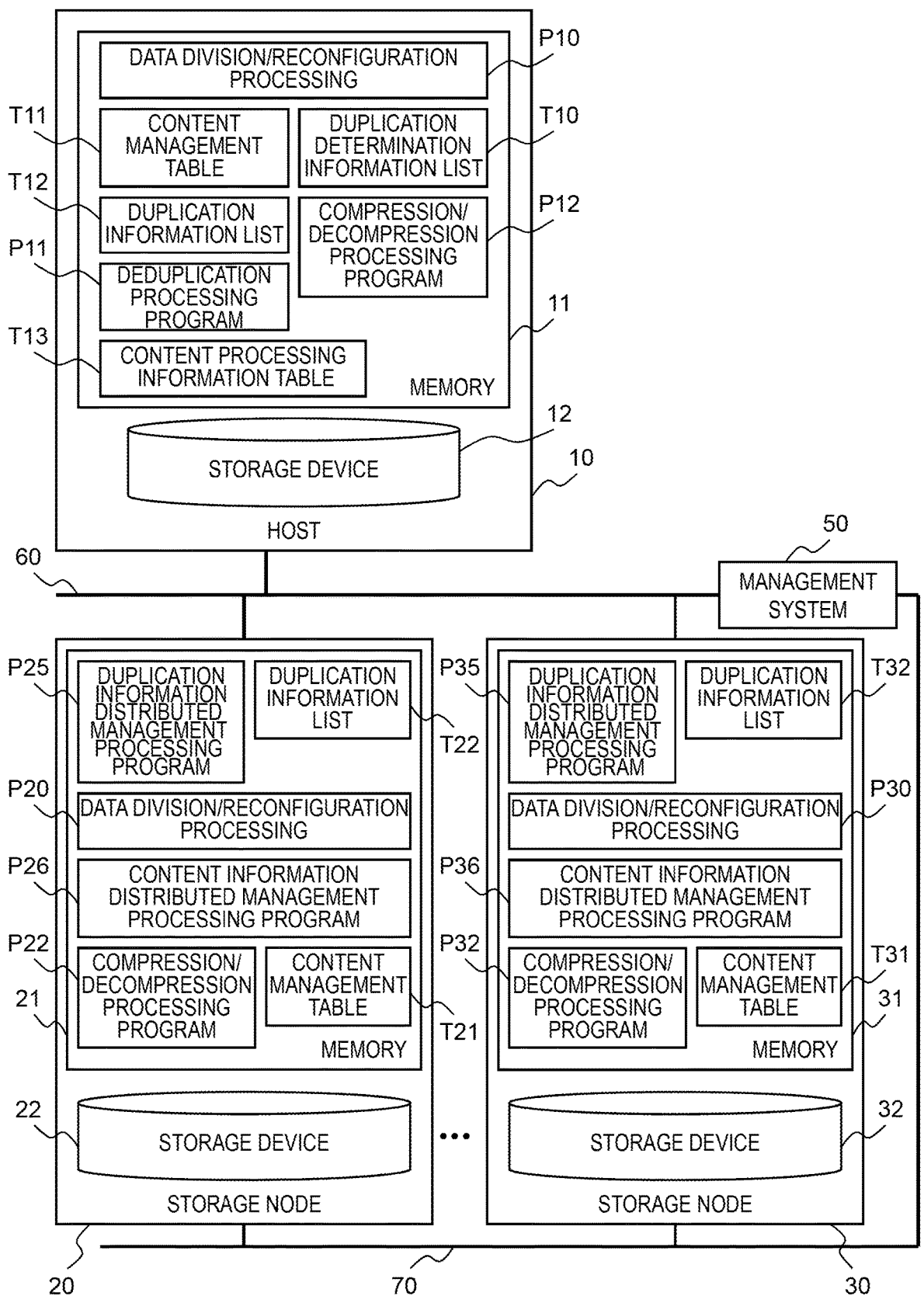
FIG. 1 is a diagram for illustrating a logical configuration of a computer system according to a first embodiment of this invention.

Referring to the accompanying drawings, a description is given of some embodiments of this invention. The embodiments described herein do not limit the invention as defined in the appended claims, and not all of components described in the embodiments and combinations thereof are always indispensable for solutions of this invention.

In the following description, various types of information are sometimes described as an expression "XX table", but the various types of information may be expressed as a data structure other than a table. In order to indicate that the information is independent of the data structure, "XX table" may be referred to as "XX information".

In the following description, in some cases, a description is given of processing with a program expressed as a subject, but the program is executed by hardware itself or a processor (for example, microprocessor (MP)) included in the hardware to conduct defined processing while appropriately using storage resources (for example, a memory) and/or communication interface devices (for example, a port). Therefore, the subject of the processing may be stated as the hardware or the processor. A program source may be, for example, a program distribution server or a storage medium.

In the following description, a technology for reducing a data amount in a storage apparatus is disclosed. The storage apparatus includes one or more storage devices for storing data. Further, a storage area provided by the one or more storage devices is referred to as "media area". The storage device is, for example, a hard disk drive (HDD), a solid state drive (SSD), or a RAID configured from a plurality of drives.

The storage apparatus manages data for each piece of content, which is logically cohesive data. Moreover, access to data is made to each piece of content. The content is a normal file, or a file in which normal files are assembled (for example, an archive file, a backup file, or a volume file of a virtual computer). The content may be a part of a file.

In a computer system according to embodiments of this invention, a host computer and a storage system cooperate with each other to conduct data reduction processing. Specifically, the host computer obtains a duplication determination list held by the storage apparatus, and executes data reduction processing. This lessens processing load on the storage apparatus, thereby presenting global deduplication in which an increase in the number of host computers does not lead to a drop in processing performance. The storage apparatus specifically sorts segments in content, and executes data reduction processing. A segment is a group of pieces of meaningful data in content.

For example, the storage apparatus determines a data reduction method for each segment. The storage apparatus identifies the segment type of each segment, and conducts the data reduction processing by following the data amount reduction method associated with the segment type in advance.

The data amount reduction processing includes, for example, only deduplication, only compression, or both the deduplication and the compression. The data amount reduction processing may not be applied to a part of the segment types. The data amount reduction method is determined for each segment type, and therefore the data amount can be reduced appropriately based on the segment type.

First Embodiment

FIG. 1 is a diagram for illustrating the logical configuration of a computer system according to a first embodiment of this invention.

A host 10 transfers data to a distributed storage system (storage nodes 20 and 30). The host 10 can be a storage system, a personal computer, a server computer, a smartphone, or the like that is set up in a branch of a company. The host 10 includes a processor 14 illustrated in FIG. 2, which executes a program, and a memory 11, which stores a program and data. The memory 11 of the host 10 stores a data division/reconfiguration processing program P10, a deduplication processing program P11, and a compression/decompression processing program P12. The memory 11 further stores a duplication determination information list T10, a content management table T11, a duplication information list T12, and a content processing information table T13.

The duplication determination information list T10 holds a unique ID (a hash value or the like) for each chunk that is created by dividing a plurality of pieces of content stored in a storage device 12 into chunks. The configuration of the duplication determination information list T10 is described later with reference to FIG. 5A. The content management table T11 holds information on chunks, which makes up content. The configuration of the content management table T11 is described later with reference to FIG. 3B. The duplication information list T12 holds information used in duplication determination. The configuration of the duplication information list T12 is described later with reference to FIG. 5B. The content processing information table T13 holds information for applying data division processing and data reduction processing on a content-by-content basis. The configuration of the content processing information table T13 is described later with reference to FIG. 3A.

The distributed storage system is made up of two or more storage nodes, namely, storage nodes 20 and 30 in this case. The computer system may include one storage node. The storage nodes 20 and 30 have the same configuration. The configuration of the storage node 20 is described and a description on the configuration of the storage node 30 is therefore omitted.

A memory 21 of the storage node 20 stores a data division/reconfiguration processing program P20, a compression/decompression processing program P22, a duplication information distributed management processing program P25, and a content information distributed management processing program P26. The memory 21 further stores a content management table T21 and a duplication information list T22.

The duplication information list T22 and a duplication information list T32 hold duplication information managed in a distributed manner by the storage nodes 20 and 30. The configuration of the duplication information lists T22 and T32 is described later with reference to FIG. 5B. The duplication information lists T22 and T32 are managed by the duplication information distributed management processing program P25 and a duplication information distributed management processing program P35, respectively. For example, the duplication information distributed management processing program P25 determines a range of unique IDs that is managed by the storage node 20 and a range of unique IDs that is managed by the storage node 30. The storage nodes 20 and 30 use the duplication information lists T22 and T32 to manage duplication information in a unique ID range assigned to the storage node 20 and duplication information in a unique ID range assigned to the storage node 30, respectively. The content management table T21 and a content management table T31 hold content configuration information managed in a distributed manner by the storage nodes 20 and 30. The configuration of the content management tables T21 and T31 is described later with reference to FIG. 3B. The content management tables T21 and T31 are managed by the content information distributed management processing program P26 and a content information distributed management processing program P36, respectively.

The host 10 determines from which content data is to be transferred to the distributed storage system. The data division/reconfiguration processing program P10 analyzes content stored in the storage device 12 to create the unique ID of data that is a part to which deduplication is applied by following information in the content processing information table T13. The host 10 registers the created unique ID to the duplication determination information list in a given order (for example, ascending order or descending order). The host 10 repeats the same processing for other pieces of content.

Over a data network 60, a host 10 sends the duplication determination information list T10 to the distributed storage system, and requests a duplication information list that is associated with unique IDs included in the duplication determination information list T10.

For instance, the storage node 20 receives the request from the host 10, divides the unique IDs on the duplication determination information list T10 by duplication information ranges managed by the storage nodes, and, over an internal network 70, transmits one of the lists created by dividing the unique IDs to the storage node 30 and requests a duplication information list. The storage node 30 receives the request from the storage node 20, which has received the request from the host 10. The storage node 30 searches for the duplication information list within itself, and sends the found duplication information list in response. The storage node 20 receives the duplication information list from the other storage node, namely, the storage node 30, and sends a response to the host 10 over the data network 60.

The host 10 stores the received response in the duplication information list T12. The host 10 also executes deduplication processing and compression processing by following information in the content processing information table T13, for each piece of content transferred to the distributed storage system, to create the content management table T11. The content management table T11 holds information on the location of deduplication destination data stored in the distributed storage system, information on compressed data, and other pieces of information. The host 10 transfers compressed and/or deduplicated data to the storage node 20 or 30 along with the content management table T11.

For example, the storage node 20 receives the data from the host 10, and the compression/decompression processing program P22 decompresses the compressed data by following information in the content management table T11. The data division/reconfiguration processing program P20 then obtains duplication destination data from the storage node 20 or 30. In this manner, the storage node 20 restores the original content and stores the restored content. Data is distributed among two or more storage nodes, namely, the storage nodes 20 and 30, to be stored, and content information of the stored data is managed in a distributed manner.

With the configuration described above, the data amount reduction effect can be improved by applying deduplication processing and/or compression processing to data in content that is deduplicated and/or compressed highly effectively. The amount of communication between the host 10 and the storage nodes 20 and 30 is reduced as a result, thereby providing fast data backup and fast data migration.

Figure 2:
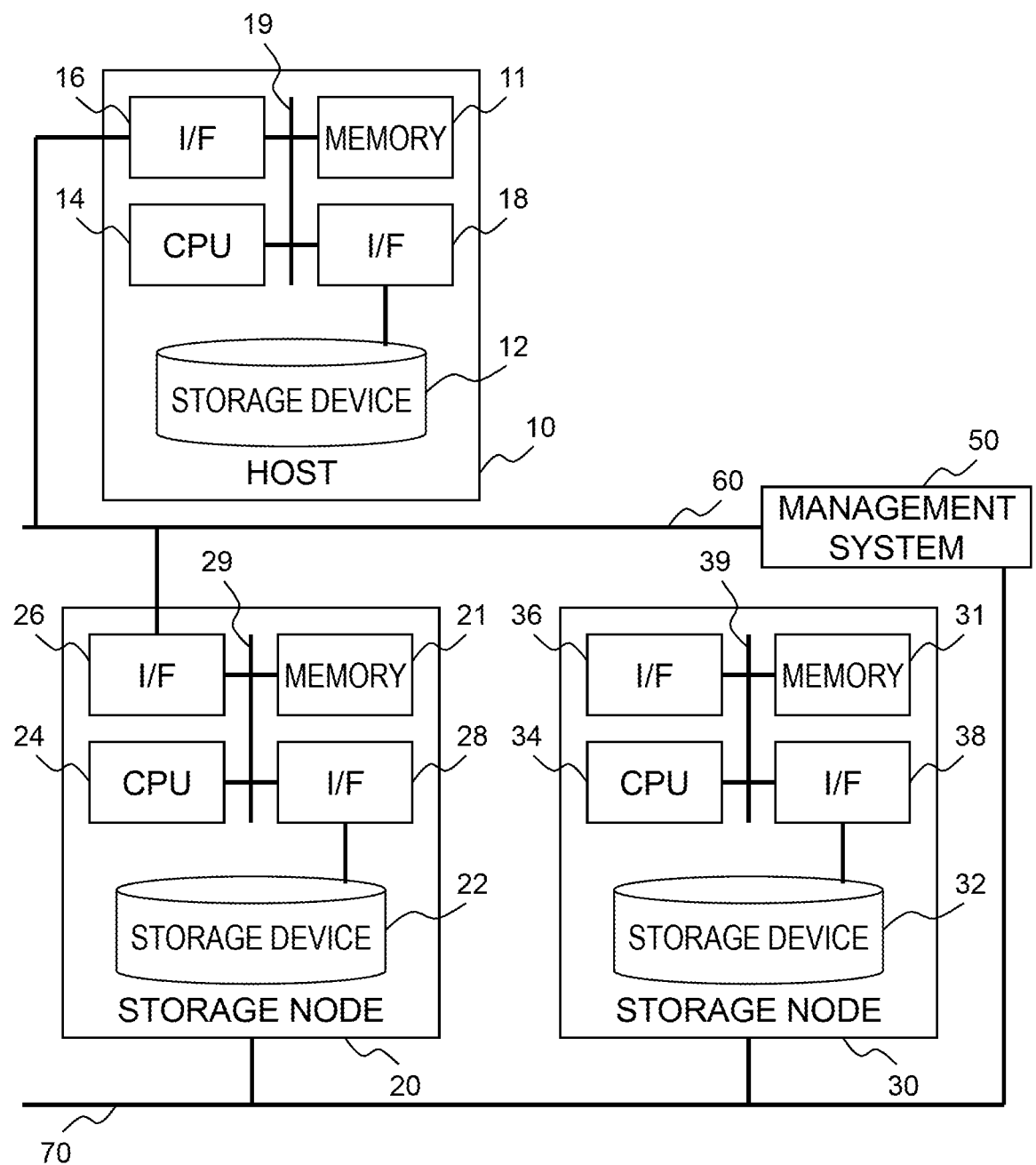
FIG. 2 is a diagram for illustrating a hardware configuration of the computer system according to the first embodiment.

FIG. 2 is a diagram for illustrating the hardware configuration of the computer system according to the first embodiment of this invention.

The storage node 20 includes a processor 24, the memory 21, a storage device interface 28, a storage device 22, and a network interface 26. The devices in the storage node 20 are coupled to one another via a system bus 29 so as to hold communication. The processor 24 and the memory 21 are an example of a controller of the storage node 20. At least some of functions of the processor 24 may be implemented by other logical circuits (for example, an FPGA).

A program executed by the processor 24 is provided to the storage node 20 via a network or a removable medium (a CD-ROM, a flash memory, or the like), and is stored in a non-volatile storage device, which is a non-transitory storage medium. It is therefore recommended for the storage node 20 to include an interface through which data is read out of a removable medium.

The storage node 30 has the same configuration as that of the storage node 20, and a description on the configuration of the storage node 30 is therefore omitted.

The storage nodes 20 and 30 are coupled to each other via the internal network 70. The storage nodes 20 and 30 are also coupled to a management system 50 via the internal network 70. An independent network separate from the internal network 70 may be provided to couple the storage nodes 20 and 30 to the management system 50. The storage nodes 20 and 30 are coupled to at least one host 10 via the data network 60. The host 10 can be, for example, a storage system, a personal computer, a server computer, or a smartphone that is set up in a branch of a company.

The management system 50 includes one or more computers. The management system 50 includes, for example, a server computer, and a terminal for accessing this server computer via a network. The administrator manages and controls the storage nodes 20 and 30 via a display device and an input device of the terminal.

The internal network 70 and the data network 60 are each, for example, a wide area network (WAN), a local area network (LAN), the Internet, a storage area network (SAN), a public line, or a dedicated line. The internal network 70 and the data network 60 may be the same network.

The host 10 includes the processor 14, the memory 11, a storage device interface 18, the storage device 12, and a network interface 16. The devices in the host 10 are coupled to one another via a system bus 19 so as to hold communication. The processor 14 and the memory 11 are examples of a controller of the host 10. At least some of functions of the processor 14 may be implemented by other logic circuits (for example, an FPGA).

A program executed by the processor 14 is provided to the host 10 via a removable medium (a CD-ROM, a flash memory, or the like) or a network, and is stored in a non-volatile storage device, which is a non-transitory storage medium. It is therefore recommended for the host 10 to include an interface through which data is read out of a removable medium.

The host 10 is a computer system configured on one physical computer, or on a plurality of logical or physical computers, and the programs described above may run on separate threads on the same computer, or may run on a virtual computer built on a plurality of physical computer resources. The host 10 and other apparatus may be housed in one physical or logical computer.

Referring back to FIG. 1, the description is continued. The memory 11 stores the data division/reconfiguration processing program P10, the deduplication processing program P11, and the compression/decompression processing program P12. The memory 11 further stores the duplication determination information list T10, the content management table T11, the duplication information list T12, and the content processing information table T13. Data stored in the memory is typically loaded from the storage device 12. The storage device 12 is, for example, an HDD, an SSD, or a RAID configured from HDDs or SSDs, which are non-volatile storage devices.

The memory 11 is used to store data read out of the storage device 12, and as a cache memory in which data received from the host 10 is temporarily stored. The memory 11 is further used as a work memory for the processor 14.

A volatile memory, for example, a DRAM, and/or a nonvolatile memory, for example, a flash memory, is used as the memory 11. The memory 11 is capable of faster data read/write than in the storage device 12.

The content processing information table T13 stores the data amount reduction processing method for each piece of content. The management system 50 is configured to set the content processing information table T13.

The processor 14 is operates as indicated by a program, a calculation parameter, or the like stored in the memory 11. The processor 14 functions as a specific functional module by operating as programmed by a program. For instance, the processor 14 executes content analysis processing and data division/reconfiguration processing as programmed by the data division/reconfiguration processing program P10. The processor 14 executes deduplication processing as programmed by the deduplication processing program P11, and executes compression/decompression processing as programmed by the compression/decompression processing program P12.

The data division/reconfiguration processing program P10 divides data of content into data to be processed by compression processing and data to be processed by deduplication processing by following information in the content processing information table T13. In deduplication processing, data is divided and the unique IDs of pieces of data created by the division are registered to the duplication determination information list T10 in ascending order or descending order. A hash value, for example, MD5, CRC, SHA-1, SHA-256, SHA-384, or SHA-512, may be used as a unique ID. The data division/reconfiguration processing program P10 applies this processing to every piece of content to be transferred to the distributed storage. The data division/reconfiguration processing program P10 also reconfigures deduplicated data by following information in the content management table T11, to restore the original data.

The deduplication processing program P11 transfers the duplication determination information list T10 to the storage nodes 20 and 30 to obtain a duplication information list that is associated with a unique ID registered on the duplication determination information list T10. The deduplication processing program P11 also uses the duplication information list to search the content and the storage nodes 20 and 30 for a block that is a duplicate of a deduplication processing subject block in the content (a block of the same data as that of the deduplication processing subject block). In a case where there is a duplicate block, the deduplication processing program P11 converts the subject block into a pointer that points to the duplicate block. The subject block in the content is not transferred to the storage node 20 or 30. The compression/decompression processing program P12 compresses and decompresses data in content. The order in which the deduplication processing and the compression processing are executed may be reversed.

The storage device 12 provides an area in which content is stored temporarily by the host 10. The processor 14 may asynchronously read content stored in the storage device 12 to execute content analysis processing, deduplication processing, and compression processing. The storage device 12 may be omitted by keeping content in the memory 11.

The storage node 20 is described. The storage node 30 has the same configuration as that of the storage node 20, and a description on the configuration of the storage node 30 is therefore omitted.

The memory 21 stores the data division/reconfiguration processing program P20, the compression/decompression processing program P22, the duplication information distributed management processing program P25, and the content information distributed management processing program P26. The memory 21 further stores the content management table T21 and the duplication information list T22. Data stored in the memory 21 is typically data transferred over the network 60 or 70, or data loaded from the storage device 22. The storage device 22 is, for example, an HDD, an SSD, or a RAID configured from HDDs or SSDs, which are non-volatile storage devices.

The memory 21 is used to store data read out of the storage device 12, and as a cache memory in which data received from the host 10 is temporarily stored. The memory 21 is further used as a work memory for the processor 24.

A volatile memory, for example, a DRAM, and/or a non-volatile memory, for example, a flash memory, is used as the memory 21. The memory 21 is capable of faster data read/write than in the storage device 22.

The processor 24 operates as indicated by a program, a calculation parameter, or the like that is stored in the memory 21. The processor 24 functions as a specific functional module by operating as programmed by a program. For instance, the processor 24 executes content analysis processing and data division/reconfiguration processing as programmed by the data division/reconfiguration processing program P20. The processor 24 executes compression/decompression processing as programmed by the compression/decompression program P12, executes duplication information distributed management processing as programmed by the duplication information distributed management processing program P25, and executes content information distributed management processing as programmed by the content information distributed management processing program P26.

The data division/reconfiguration processing program P20 reconfigures data of content by following information in the content management table T11 transferred from the host 10, or content information configured from the content management table T21 by the content information distributed management processing program P26, in cooperation with the duplication information distributed management processing program P25 and the content information distributed management processing program P26. In a case where a duplication information list obtaining request is received from the host 10, the data division/reconfiguration processing program P20 obtains requested duplication information in cooperation with the duplication information distributed management processing program P25.

The compression/decompression program P12 compresses and decompresses data in content.

The duplication information distributed management processing program P25 determines a range of unique IDs that is managed by the storage node 20 and a range of unique IDs that is managed by the storage node 30 in cooperation with the duplication information distributed management processing program P35 of the other storage node, namely, the storage node 30. This management uses, for example, a consistent hash table, which is a distributed hash table (DHT). Each node manages only the determined unique ID range in a duplication information list. The duplication information distributed management processing program P25 also manages the unique ID management range of each storage node. The duplication information distributed management processing program of every node (for example, the programs P25 and P35) can accordingly add, search, update, and delete a duplication information list. The duplication information distributed management processing program P25 may manage the duplication information list T22 on the principle of LRU. The duplication information distributed management processing program P25 further executes rebalancing processing in which the management ranges are adjusted automatically and data is migrated when the storage node 20 or 30 is deleted or added.

The content information distributed management processing program P26 manages, for each piece of content, a node in which the piece of content is located. For example, the information may be obtained solely by calculation as in CRUSH, or may be managed in a DHT. The content information distributed management processing program P26 may manage, for each offset of content, a node in which the content is located.

The storage device 22 provides an area in which content and control information are stored temporarily by the storage node 20. The processor 24 may asynchronously read content stored in the storage device 22 to execute content analysis processing, deduplication processing, and compression processing. The storage device 22 may be omitted by keeping content in the memory 25.

FIG. 3A is a diagram for illustrating an example of the configuration of the content processing information table T13.

The content processing information table T13 has a table structure, and a data amount reduction method is recorded in the content processing information table T13 for each segment type of content. The content processing information table T13 is thus used to effectively reduce the amount of data for each content type separately. The content processing information table T13 is created by the management system 50 and is stored in the host 10. In the content processing information table T13, a processing method specified by a user is recorded for each content type separately.

The content processing information table T13 includes a content type information column T2, a content type column T4, and a data amount reduction processing specifics column T6. The data amount reduction processing specifics column T6 includes a compression application size column T50, a decompression column T51, a deduplication unit column T52, a header portion column T53, a metadata portion column T54, a body portion column T55, and a trailer portion column T56.

The compression application size column T50 indicates the maximum size of content to which compression is applied.

The decompression column T51 indicates whether content to which compression processing has been applied is to be decompressed before the data amount reduction processing for the content. A data amount can be reduced more effectively by decompressing the compressed content before data rearrangement processing and the data amount reduction processing.

The deduplication unit column T52 indicates by what method and into what size data is to be divided when deduplication is applied to content. Examples of the method of division include file-by-file division, fixed length division, and variable length division. In file-by-file division, deduplication is applied on a file-by-file basis. In fixed length division, data is divided into pieces of a fixed length, and then deduplication is applied. In variable length division, data is divided into pieces of a variable length, and then deduplication is applied. A rolling hash may be used to find a point of division.

The header portion column T53 to the trailer portion column T56 each indicate a data amount reduction method for the corresponding segment type. The header portion column T53 indicates a data reduction method for a header portion in the content. The metadata portion column T54 indicates a data reduction method for a metadata portion in the content. The body portion column T55 indicates a data reduction method for a body portion in the content. The trailer portion column T56 indicates a data reduction method for a trailer portion in the content.

The data amount reduction processing specifics column T6 indicates four data amount reduction methods applicable to subject data. Of the four methods, one method conducts both deduplication processing and compression processing, one method conducts only deduplication processing, one method conducts only compression processing, and one method does not conduct data amount reduction processing.

For instance, data decompression processing is executed for content having "C" as the content type. Compression processing alone is then executed for the header segment and the metadata segment. Deduplication processing and compression processing are executed for the body segment and the trailer segment. Only file-by-file deduplication processing is applied to content having "B" as the content type.

FIG. 3B is a diagram for illustrating an example of the configuration of the content management table T11 in the first embodiment. The content management tables T21 and T31 have the same configuration as that of the content management table T11 illustrated in FIG. 3B, and a description on the configuration of the content management tables T21 and T31 is therefore omitted.

The content management table T11 indicates a relation between data locations before and after data reduction processing. The content management table T11 enables the data division/reconfiguration processing program P10 to convert content from a structure after data reduction processing into a structure prior to the data reduction processing. Content management can be made efficient by storing the content management table T11 as an attachment to content in a media area, which is configured from the storage devices 22 and 32.

The content management table T11 in the first embodiment includes an offset column T61, a size column T62, a storage destination compression unit number column T63, an intra-storage destination compression unit offset column T64, and a deduplication destination column T65. Cells in the columns T61 to T65 that are in the same row make up one entry. Each entry represents one data block in content. In each data block, the same data reduction method is executed throughout the data block. A data block is configured from, for example, one segment, a plurality of segments, or partial data in one segment.

The content management table T11 further includes a compression unit number column T70, a post-compression application data offset column T71, an applied compression type column T72, a pre-compression size column T73, and a post-compression size column T74. Cells in the columns T70 to T74 that are in the same row make up one entry. Each entry indicates information on one compression unit. A compression unit is the unit of data on which compression processing is executed after rearrangement, and corresponds to a post-deduplication processing assembled segment group and non-assembled segment.

The offset column T61 indicates the offset of a data block in content. The size column T62 indicates the data length of each data block. The storage destination compression unit number column T63 indicates a number assigned to a compression unit in which a data block is stored. The intra-storage destination compression unit offset column T64 indicates an offset in a compression unit storing a data block to which deduplication is not applied.

The deduplication destination column T65 indicates the location of reference destination data of a data block to which deduplication processing is applied. A reference destination is expressed by a content ID and an offset.

The compression unit number column T70 indicates a number assigned to a compression unit. Compression units are assigned numbers in order, starting from a compression unit at the head of post-deduplication and pre-compression content. The post-compression application data offset column T71 indicates the offset of a compression unit in content after compression. The location of a data block after compression is accordingly identified from the value of the storage destination compression unit number column T63 and the value of the intra-storage destination compression unit offset column T64.

The applied compression type column T72 indicates the type of data compression applied to a compression unit. The pre-compression size column T73 indicates the data size of a compression unit prior to compression, and the post-compression size column T74 indicates the data size of the compression unit after the compression.

A data block represented by an entry T40 on the third row, for example, has an offset of 150 (B) and a data size of 100 B. This data block is stored, in pre-compression content, at a location corresponding to an offset of 150 (B) in a compression unit that has a compression number "4". In other words, this data block is data that is found at 100 B from a location corresponding to an offset of 150 (B) in the fourth compression unit from the head after decompression processing of content stored in a media area.

Pieces of content in various formats are described next with reference to FIG. 4A to FIG. 4D. There is no structure common to all pieces of content stored in the host 10 and the distributed storage system. In a case where specific data exists in a specific position of content, and the host 10 or the distributed storage system for processing the content knows of its existence, the structure of the content is defined.

In other words, even if characteristic data exists in content but the host 10 or the distributed storage system does not recognize its existence, such a state is equivalent in meaning to a state in which the content does not have a specific structure. In this embodiment, only a content type for which the content structure information 51 indicates a content structure has a content structure.

For example, the host 10 stores content structure information (not shown), which indicates structure information on each content type. For example, the content structure information includes a position of the header portion in the content, the size of the content, format information for reading the header portion, and format information for reading other management segments of the content. The management segments are segments other than the body portion.

Figure 4A:
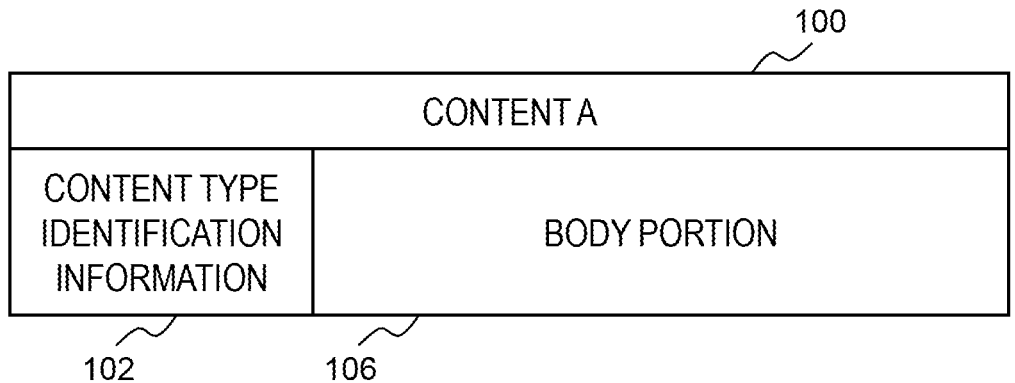
FIG. 4A is a diagram for illustrating an example of a configuration of a content having a content type "A" according to the first embodiment.

FIG. 4A is a diagram for illustrating an example of the configuration of a content 100 having a content type "A".

The content A (100) includes a content ID portion 102 and a body portion 106, which does not substantially have a structure. Those portions are segments. The content ID portion 102 includes content type identification information, and indicates an application that has generated the content.

The content ID portion 102 is also referred to as "magic number", and generally placed at the head of the content. As another example of the content having the content type "A", there exists content that does not include the content ID portion 102 and does not have any structure. The data division/reconfiguration processing programs P10, P20, and P30 handle the content ID portion 102 and the body portion 106 together in the content having the content type "A".

Figure 4B:
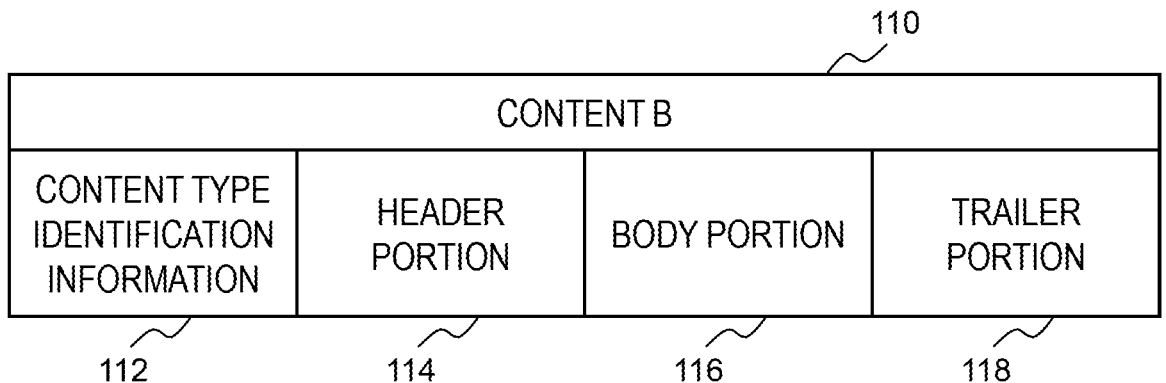
FIG. 4B is a diagram for illustrating an example of a configuration of a content having a content type "B" according to the first embodiment.

FIG. 4B is a diagram for illustrating an example of the configuration of a content 110 having a content type "B".

The content. B (110) includes a content ID portion 112, a header portion 114, a body portion 116, and a trailer portion 118. Each of those portions is a segment.

The header portion 114 is a description of the structure of the content, and is placed near the head of the content. The data division/reconfiguration processing programs P10, P20, and P30 find out the position and size of the header portion 114 in the content 110, which is classified as the content type "B", and how to read the header portion 114, by referring to the content structure information.

The header portion 114 indicates structure information of other segments. The data division/reconfiguration processing programs P10, P20, and P30 can find out the positions and sizes of the body portion 116 and the trailer portion 118 in the content 110 by analyzing the header portion 114. The data division/reconfiguration processing programs P10, P20, and P30 obtain detailed information on the components of the body portion 116 and about the locations of the components from the header portion 114. The content ID portion 112 and the header portion 114 may be handled as one segment. The header portion 114 may include information on the position and the size of the header portion 114.

Figure 4C:
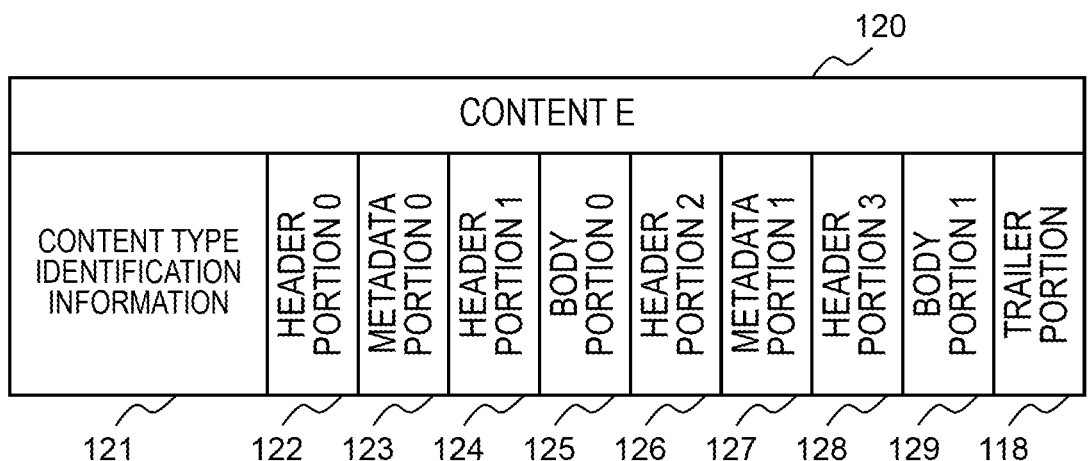
FIG. 4C is a diagram for illustrating an example of a configuration of a content having a content type "E" according to the first embodiment.

The trailer portion 118 is placed at the end of the content 110, and information stored therein is not defined. For example, the trailer portion 118 includes information on the entire content 110, for example, the content size, and can be used to check validity of content processing or the like. The trailer portion 118 may include padding data, which is logically meaningless data. FIG. 4C is a diagram for illustrating an example of the configuration of a content 120 having a content type "E".

The content E (120) includes a content ID portion 121, a header portion 0 (122), a metadata portion 0 (123), a header portion 1 (124), a body portion 0 (125), a header portion 2 (126), a metadata portion 1 (127), a header portion 3 (128), a body portion 1 (129), and the trailer portion (118). Each of those portions is a segment.

In the content E (120), each header portion includes information for coupling a metadata portion and a body portion to form one piece of content. In other words, the header portion 0 to the header portion 3 are information for coupling the metadata portion 0, the body portion 0, the metadata portion 1, and the body portion 1 as one piece of content.

The header portion 1 to the header portion 3 each include, for example, structure information on subsequent segments up to the next header portion. The header portion may include structure information on all the segments in the content. The header portion may include information on the type, the position, and the size of the subsequent segment up to the next header portion. The header portion may include structure information on all the subsequent segments.

For example, the content structure information indicates the structure information on the first header portion 0 (122). The header portion 0 (122) indicates the positions and the sizes of the metadata portion 0 (123) and the next header portion 1 (124).

The header portion 1 (124) indicates the types, the positions, and the sizes of the body portion 1 (125) and the next header portion 2 (126). The header portion 2 (126) indicates the types, the positions, and the sizes of the metadata portion 1 (127) and the next header portion 3 (128). The header portion 3 (128) indicates the types, the positions, and the sizes of the body portion 2 (129) and the trailer portion 118.

User data is stored in the body portion 0 (125) and the body portion 1 (129). The meta data portion 0 (123) stores, for example, the position and font information of the data stored in the body portion 0 (125). The metadata portion 1 (127) stores, for example, information on the position in the body portion of the data stored in the body portion 1 (129), and font information of the stored data.

Figure 4D:
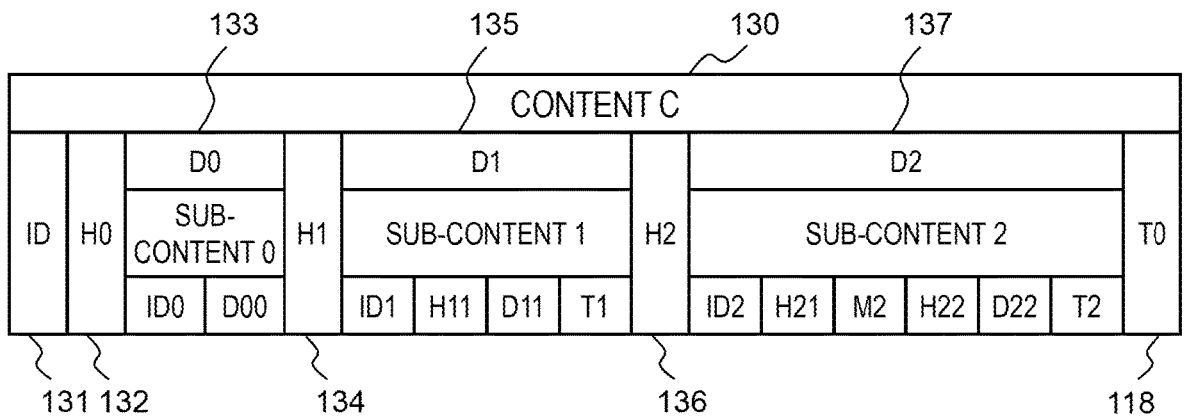
FIG. 4D is a diagram for illustrating an example of a configuration of a content having a content type "C" according to the first embodiment.

FIG. 4D is a diagram for illustrating an example of the configuration of a content 130 having a content type C.

The content 130 includes a content ID portion (131), a header portion H0 (132), a header portion H1 (134), a header portion H2 (136), a body portion D0 (133), a body portion D1 (135), a body portion D2 (137) and a trailer portion T0 (118).

In the example illustrated in FIG. 4D, the body portions D0 (133), D1 (135), and D2 (137) include one or more pieces of sub-content. Specifically, the body portion D0 (133) includes a sub-content 0, the body portion D1 (135) includes a sub-content 1, and the body portion D2 (137) includes a sub-content 2.

The header portion H0 (132), the header portion H1 (134), and the header portion H2 (136) include information for coupling the body portion D0 (133), the body portion D1 (135), the body portion D2 (137), and the trailer portion TO (118) to one another to form one piece of content.

The information included in the header portions of the content. D (130) is the same as the information included in the header portions of the content E (120) illustrated in FIG. 4C. For example, the header portion H0 (132), the header portion H1 (134), and the header portion H2 (136) each indicate the structure information on the respective segments up to the next header portion. The information on the type of the body portion included in the header portion indicates that the body portion is sub-content.

The sub-content may include a header portion, a body portion, a metadata portion, and the like. The header portion in the sub-content indicates information on the internal structure of the sub-content, and includes information for coupling the other segments in the sub-content to for in one piece of sub-content. In this structure, the body portion, which is the sub-content, is constructed by a plurality of segments.

In the example illustrated in FIG. 4D, the content structures of the sub-contents 0, 1, and 2 are the same as those of the content A (100), the content B (110), and the content E (120), respectively. In other words, the respective content types indicated by the content IDs of the sub-contents 0, 1, and 2 are the same as the content types of the content A (100), the content B (110), and the content E (120). The data division/reconfiguration processing program P10 analyzes the sub-content based on the content type indicated by the content ID portion of the sub-content.

For example, in a case where the content D (130) is an archive file unifying the sub-content 0, the sub-content 1, and the sub-content 2, the content D (130) has the sub-content structure described above. In addition, a backup file, a virtual disk volume, and a rich media file may have such a structure.

Figure 5A:
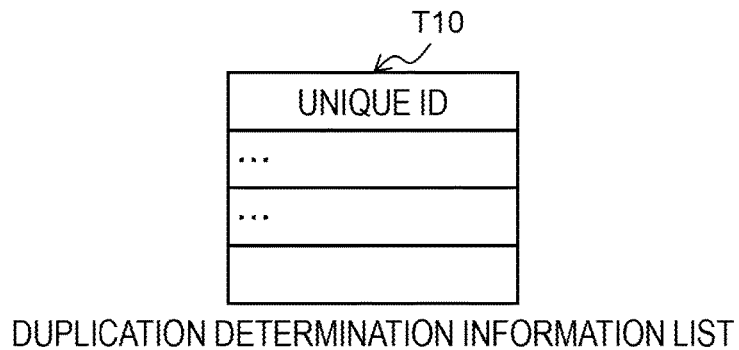
FIG. 5A is a diagram for illustrating an example of a configuration of a duplication determination information list according to the first embodiment.

FIG. 5A is a diagram for illustrating an example of the configuration of the duplication determination information list T10.

The duplication determination information list T10 is a list of unique IDs in which unique IDs are registered in ascending or descending order.

Figure 5B:
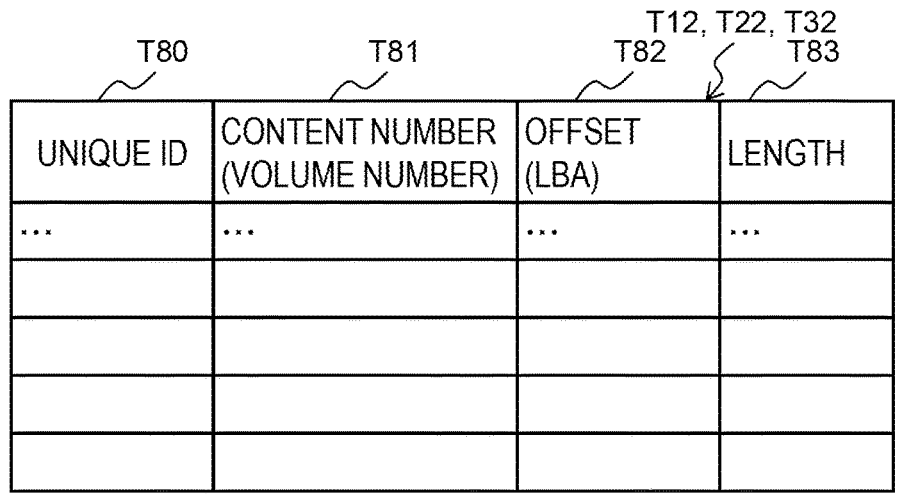
FIG. 5B is a diagram for illustrating an example of a configuration of a duplication information list according to the first embodiment.

FIG. 5B is a diagram for illustrating an example of the configuration of the duplication information list. T12. The duplication information lists T22 and T32 have the same configuration as that of the duplication information list T12 illustrated in FIG. 5B, and a description on the configuration of the duplication information lists T22 and T32 is therefore omitted.

The duplication information list T12 includes a unique ID (T80), a content number (or volume number) T81, an offset (or LBA) T82, and a length T83.

A unique ID is stored as the unique ID (T80). The stored unique ID is assigned to data at the length T83 from an offset or an LBA that is indicated by the offset T82 in a piece of content or a volume that is indicated by the content number T81. In a case where the data does not have a variable length, the length T83 may be omitted.

Figure 6:
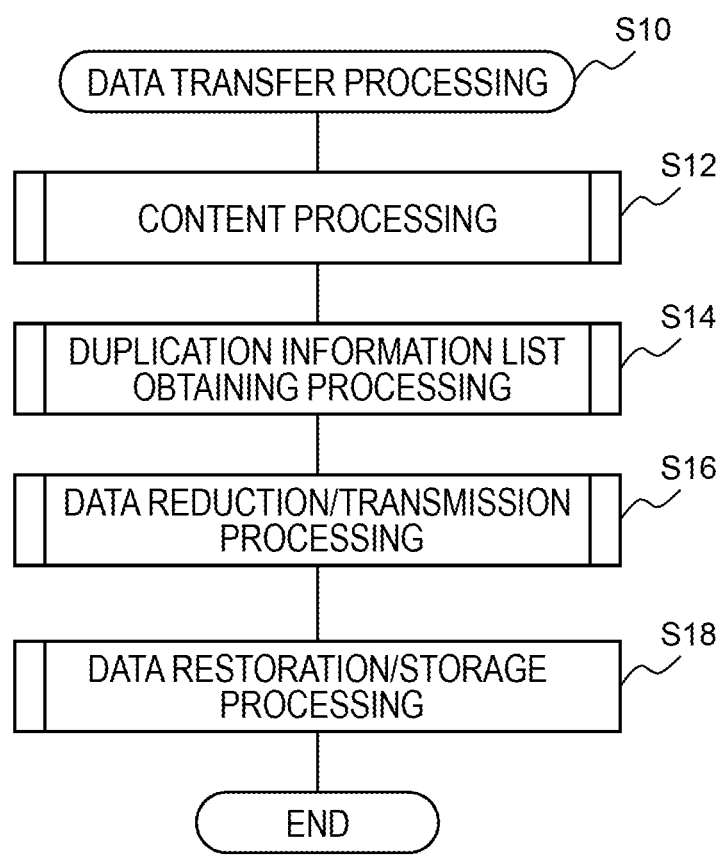
FIG. 6 is a flowchart of processing of transferring data according to the first embodiment.

FIG. 6 is a flowchart of processing of transferring data from the host 10 to the distributed storage system (the storage nodes 20 and 30).

First, the host 10 executes content processing in which content is analyzed, data is divided, and the duplication determination information list T10 is created (Step S12). Details of the content processing are described later with reference to FIG. 7.

The host 10 then uses the duplication determination information list T10 to execute duplication information list obtaining processing in which the duplication information list T12 is obtained from the distributed storage system (Step S14). Details of the duplication information list obtaining processing are described later with reference to FIG. 9.

The host 10 then uses the obtained duplication information list T12 to execute data reduction/transmission processing in which deduplication processing and compression processing are executed, the content management table T11 is created, and data reduced in amount is transferred to the distributed storage (Step S16). Details of the data reduction/transmission processing are described later with reference to FIG. 10.

The distributed storage system uses the received data and the content management table T21 to execute data restoration/storage processing in which data restoration processing is conducted and restored data is stored in one of the storage nodes 20 and 30 (Step S18). Details of the data restoration/storage processing are described later with reference to FIG. 11.

Figure 7:
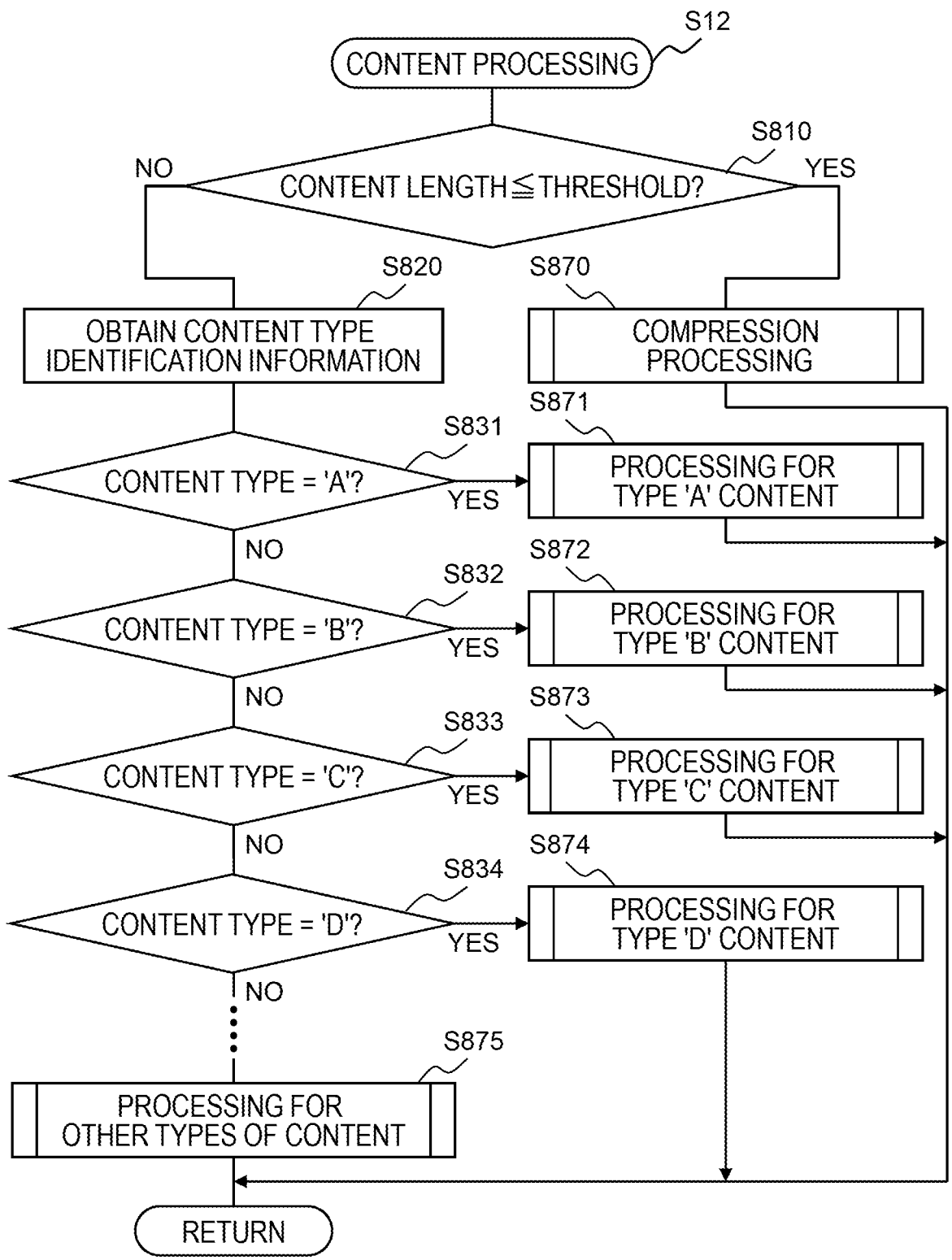
FIG. 7 is a flowchart of content processing according to the first embodiment.

FIG. 7 is a flowchart for illustrating details of the content processing (Step S12), which is executed by the host 10.

The host 10 executes the content processing (Step S12) synchronously or asynchronously with the reception of content. For example, the host 10 may store received content temporarily in the storage device 12 to execute the content processing asynchronously with the reception of content by reading the stored content onto the memory 11. The host 10 may also store received content temporarily in the memory 11 to execute the content processing.

First, the data division/reconfiguration processing program P10 determines whether the size of the entire content is equal to or less than a given threshold (Step S810). The data division/reconfiguration processing program P10 can obtain information on the content length from, for example, management information in the content or a command received together with the content by the storage node 20 or 30.

In a case where the content length is equal to or less than the given threshold (YES in Step S810), the compression/decompression program 36 conducts compression processing for the entire content (Step S870). Data compression improves data storage efficiency only slightly when content analyzed is small in data size. Efficient processing is accordingly accomplished by omitting compression processing for small-sized data. Deduplication may be applied to content small in size.

In a case where the content length is larger than the given threshold (NO in Step S810), on the other hand, the data division/reconfiguration processing program P10 refers to the content ID portion in the content to obtain information for identifying the content type (Step S820). The content ID portion exists at a specific position, for example, the head of the content, independently of the content structure, and therefore the data division/reconfiguration processing program P10 can identify the content ID portion in content having any structure. The data division/reconfiguration processing program P10 may convert a value representing the content type obtained from the content ID portion to a value used only in the apparatus.

The host 10 then selects and executes processing corresponding to the received content based on the information on the content type obtained in Step S820. Specifically, in Step S831, the data division/reconfiguration processing program P10 determines whether the content type of the received content is "A".

In a case where the content type is "A" (YES in Step S831), the data division/reconfiguration processing program P10 executes processing prepared for content that has "A" as the content type (Step S871). In a case where the content type is not "A" (NO in Step S831), on the other hand, the data division/reconfiguration processing program P10 determines whether the content type of the received content is "B" (Step S832).

In a case where the content type is "B" (YES in Step S832), the data division/reconfiguration processing program P10 executes processing prepared for content that has "B" as the content type (Step S872). In a case where the content type is not "B" (NO in Step S832), on the other hand, the data division/reconfiguration processing program P10 determines whether the content type of the received content is "C" (Step S833).

In a case where the content type is "C" (YES in Step S833), the data division/reconfiguration processing program P10 executes processing prepared for content that has "C" as the content type (Step S873). In a case where the content type is not "C" (NO in Step S833), on the other hand, the data division/reconfiguration processing program P10 determines whether the content type of the received content is "D" (Step S834).

In a case where the content type is "D" (YES in Step S834), the data division/reconfiguration processing program P10 executes processing prepared for content that has "D" as the content type (Step S874). In a case where the content type is not "D" (NO in Step S833), on the other hand, the data division/reconfiguration processing program P10 executes the same processing for other content types as well. The number of content types for each of which unique processing is prepared is finite. The data division/reconfiguration processing program P10 determines content types in order, and executes processing prepared for content of a determined content type.

In a case where the content type of the received content matches none of the content types defined in advance, the data division/reconfiguration processing program P10 proceeds to Step S876. The processor 14 executes processing prepared for other types of content.

In Step S871 to Step S874, the data division/reconfiguration processing program P10 uses the result of an analysis of the content being processed to execute processing for each piece of content, and ends the content processing (Step S12).

Figure 8:
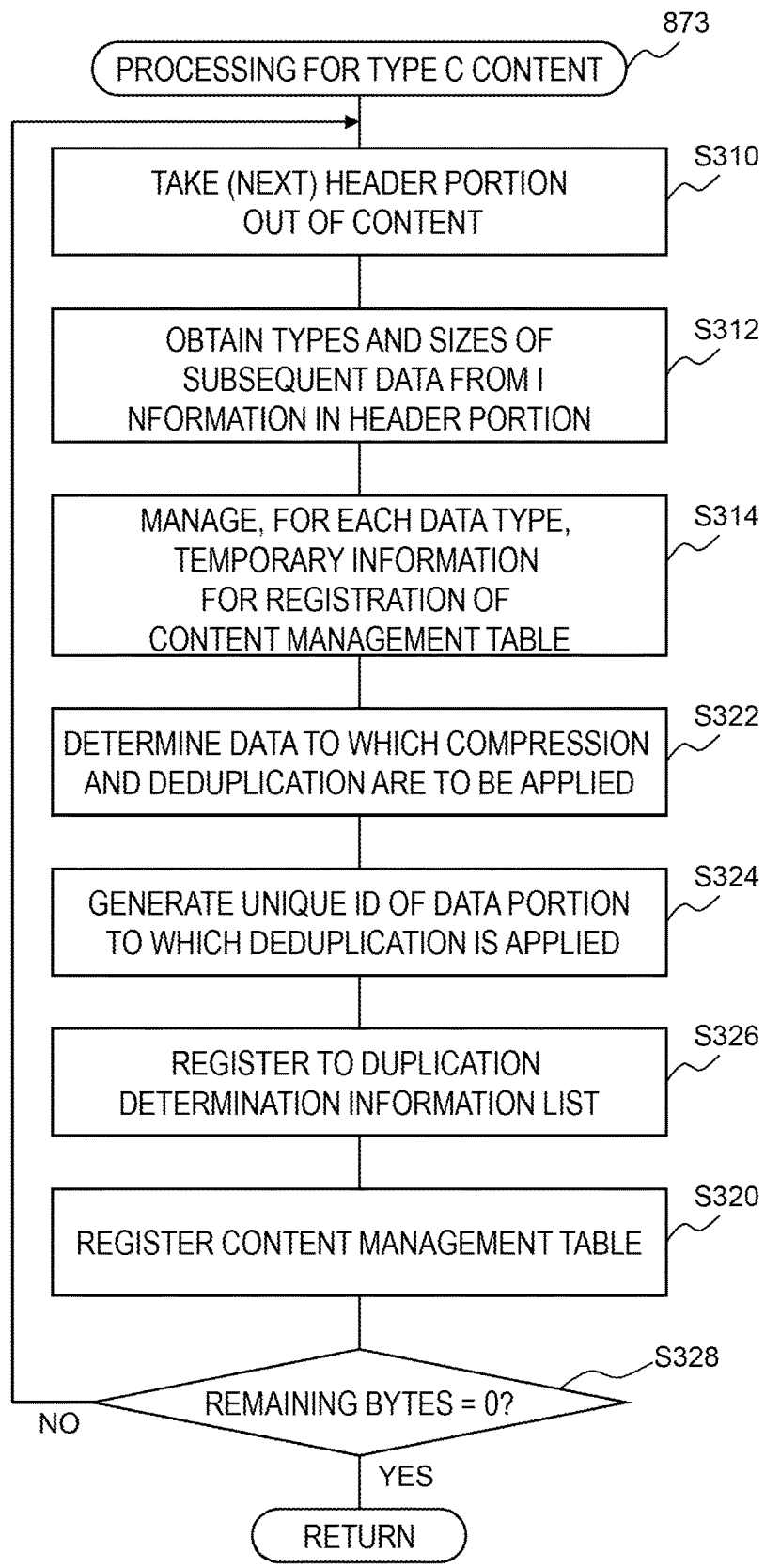
FIG. 8 is a flowchart of processing that is executed for the content having the content type "C" according to the first embodiment.

FIG. 8 is a flowchart for illustrating details of Step S873 in the flowchart of FIG. 7, namely, processing that is executed for the content (130) having the content type "C". An example of the configuration of content having the content type "C" is already described with reference to FIG. 4D.

The data division/reconfiguration processing program P10 obtains content type information from the content ID portion 131, and Step S873 is executed after the data division/reconfiguration processing program P10 determines the content type. The host 10 (the processor 14) executes Step S873 on the premise that the content type of the subject content is "C". An example of processing the content C (130) illustrated in FIG. 4D is described below with reference to the flowchart of FIG. 8.

The data division/reconfiguration processing program P10 refers to the decompression column T51 in the content processing information table T13, and decompresses the content as needed (Step S310).

The data division/reconfiguration processing program P10 next refers to structure information of the header portion H0 (132) in the content structure information 51 to obtain structure information of the subsequent segments from the header portion H0 (132) (Step S312). The header portion H0 (132) includes information on the type, position (offset), and data length of the body portion D0 (133), and information on the type, position, and data length of the header portion H1 (134).

The header portion H0 (132) includes information indicating that the body portion D0 (133) is sub-content. The data division/reconfiguration processing program P10 analyzes the body portion D0 (133) and refers to the content ID portion ID1 of the body portion D0 (133) to determine the content type of the sub-content 0. The data division/reconfiguration processing program P10 determines the type, position (offset), and size of each segment in the sub-content 0.

The data division/reconfiguration processing program P10 temporarily keeps the result of the analysis in the memory 11 to manage the analysis result (Step S314). The analysis result includes, for each segment, the pre-data reduction processing offset, size, post-data reduction processing offset, and segment type of the segment. The analysis result here includes information on the types, positions, and sizes of the content ID portion 131 and of the header portion H0 (132), and the type, position, and size of each segment that are obtained from the analysis of the body portion D0 (133).

The data division/reconfiguration processing program P10 obtains, from the next header portion, namely, the header portion H1 (134), structure information of the subsequent segments. Specifically, the data division/reconfiguration processing program P10 obtains information on the types, positions, and sizes of the body portion D1 (135) and the header portion H2 (136) (Step S312).

The data division/reconfiguration processing program P10 analyzes the body portion D1 (135). The data division/reconfiguration processing program P10 adds structure information of the header portion H1 (134) and the body portion D1 (135) to the analysis result stored in the memory 11 (Step S314).

The data division/reconfiguration processing program P10 next refers to the content processing information table T13 to determine data to which compression and deduplication are to be applied (Step S322). The data division/reconfiguration processing program P10 extracts a point of data division at which deduplication is to be applied, and generates a unique ID for each data portion created by division (Step S324). The data division/reconfiguration processing program P10 registers the generated unique ID to the duplication determination information list T10 (Step S326). When registered to the duplication determination information list T10, the unique IDs may be sorted in ascending order or descending order, or may be added in an order in which the unique IDs are generated.

The duplication determination information list T10 then registers the content management table T11 in the memory, which has been used as temporary information (Step S320). The content management table T11 may be registered in the memory or may be written out to the storage device 12.

The data division/reconfiguration processing program P10 repeatedly executes the content processing until the end of the content is reached. When the end of the content is reached, the content processing is ended (Step S328).

Figure 9:
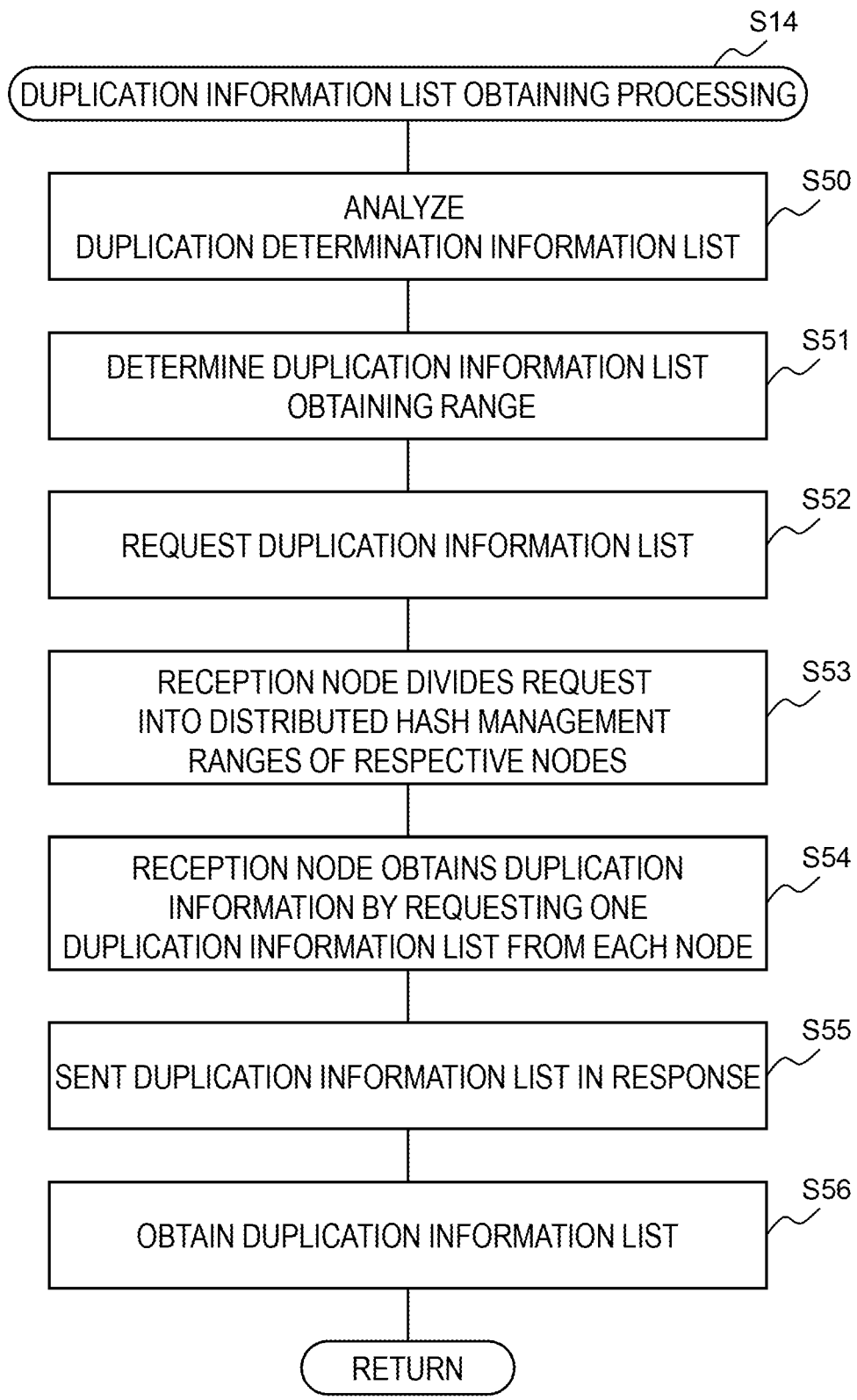
FIG. 9 is a flowchart of duplication information list obtaining processing according to the first embodiment.

FIG. 9 is a flowchart for illustrating details of the duplication information list obtaining processing (Step S14).

The deduplication processing program P11 analyzes the duplication determination information list T10 (Step S50). In a case where unique IDs are registered in a random order in the duplication determination information list T10, the unique IDs are sorted in ascending order or descending order. In a case where the unique IDs are in ascending order, a place in which unique IDs appear in succession, or substantially in succession is identified, and is substituted with a minimum value of unique IDs in the identified range, and a difference between the minimum value and a maximum value of the unique IDs in the range. For example, in a case where a given number of unique IDs or more are included in a given range, it can be determined that unique IDs appear in succession or substantially in succession. It is recommended to set the given number and the given range that are used for this determination so that the amount of data for representing a unique ID is small.

In a case where a plurality of (n) unique IDs counted from the minimum value are in succession in this range, for example, the range is expressed by the minimum value of the unique IDs and the number of successive unique IDs (i.e., the minimum value+n) as shown below.

Minimum value of unique IDs
+n

The range of unique IDs may be expressed by a difference from the immediately preceding unique ID. For example, in a case where unique IDs appear substantially in succession in a manner that gives an ID next to the minimum value in the range a value that is obtained by adding 2 to the minimum value, and the second next ID has a value obtained by adding 4 to the next unique ID (or a value obtained by adding 6 to the minimum value), the range is expressed by the minimum value of the unique IDs and 2 and 4 as shown below.

Minimum value of unique IDs
2
4

In other words, a duplication information list obtaining range is a combination of a portion expressed by one of 1) the minimum value of unique IDs+a difference from the maximum value and 2) the minimum value of unique IDs+a difference between unique IDs, and a portion expressed by individual unique IDs (Step S51). It is recommended to determine whether the range is expressed by unique IDs as they are or by the difference between IDs based on whether a data amount spent to indicate the difference between unique IDs is larger than a data amount spent to represent the unique IDs. For example, in a case where 20 bytes are spent to indicate the difference between IDs, which is the same data amount that is spent to represent the unique IDs, unique IDs are registered as they are. The host 10 uses the modified duplication determination information list T10 to request the distributed storage system to obtain a duplication information list (Step S52).

The distributed storage system (the storage nodes 20 and 30) receives the duplication information list obtaining request, and the duplication information distributed management processing program P25 divides the request between the storage nodes 20 and 30 based on the management ranges of the duplication information lists T22 and T32 (Step S53). Specifically, the duplication information list obtaining range is divided for each storage node into pairs of a minimum value and maximum value of unique IDs, individual unique IDs as they are, and combinations of the former and the latter in the range managed by the storage node.

The storage node that has received the request from the host 10 (the reception node 20) makes an inquiry about a duplication information list in the divided duplication information list obtaining range to the other storage node, namely, the storage node 30 (Step S54). Efficient inquiry is accomplished in this manner. The reception node 20 receives the duplication information list, generates a duplication information list that is generated by merging duplication information lists managed by the respective nodes, and sends the generated duplication information list to the host 10 in response (Step S55).

The host 10 obtains the duplication information list from the reception node 20 (Step S56).

Figure 10:
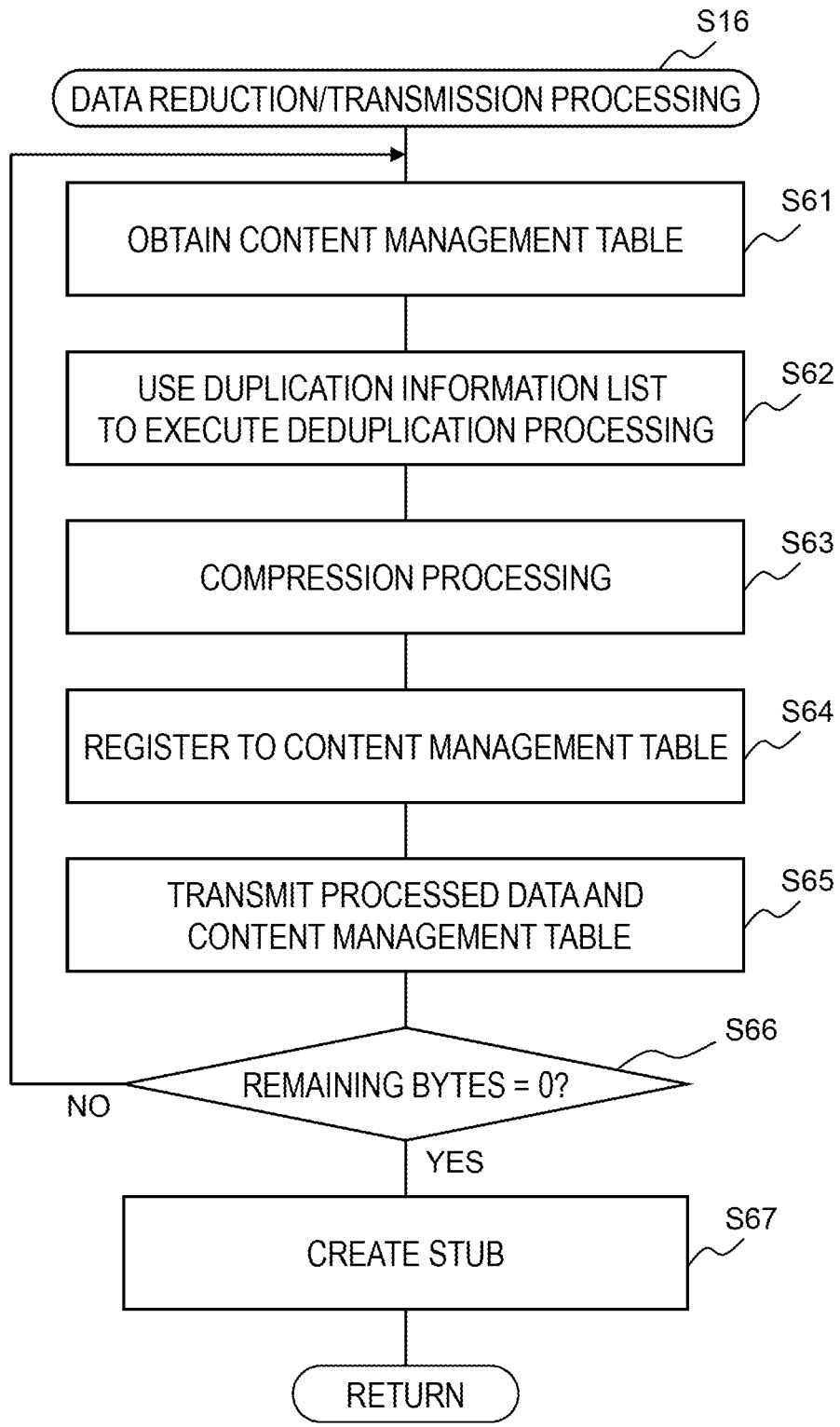
FIG. 10 is a flowchart of data reduction/transmission processing according to the first embodiment.

FIG. 10 is a flowchart for illustrating details of the data reduction/transmission processing (Step S16).

The data reduction/transmission processing (Step S16) is applied to every piece of content transferred from the host 10 to the storage node 20 or 30.

The data division/reconfiguration processing program P10 obtains the content management table T11 of content to be transferred (Step S61).

Next, the deduplication processing program P11 executes deduplication processing by following instructions from the data division/reconfiguration processing program P10 (Step S62). The deduplication processing program P11 obtains, from the memory 11, information on blocks (segments) to which deduplication processing is to be applied, and executes deduplication processing for each of the blocks.

Specifically, the deduplication processing program P11 divides data by fixed length division, variable length division, or division on a file-by-file basis, calculates a fingerprint (a hash or the like), and uses binary comparison, a combination of fingerprinting and binary comparison, or the like to execute duplication determination. In a case where it is determined that a specific block is to be deduplicated, the deduplication processing program P11 deletes the block to which deduplication is applied. The deduplication processing program P11 stores the value of the post-rearrangement offset of the deduplicated data in the intra-storage destination compression unit offset column T64, and updates the deduplication destination column T65 with reference information of the deduplication destination.

The deduplication processing program P11 further conducts duplication determination for the entire data block in an entry of the content management table T11. The deduplication processing program P11 may conduct duplication determination for partial data in the entry. In a case where duplication determination is to be conducted for partial data, one cell in the deduplication destination column T65 stores a plurality of references in some cases. The intra-storage destination compression unit offset column T64 indicates the post-reduction size of the data as well. In addition to, or in place of, information on the deduplication destination in the content management table T11, a pointer pointing to the duplication destination may be stored at the starting point of the deleted data. The duplication information list T12 may delete data by LRU.

Next, the compression/decompression processing program P12 executes compression processing by following instructions from the data division/reconfiguration processing program P10 (Step S63). Specifically, the compression/decompression processing program P12 determines a compression unit in deduplicated content. For example, the compression/decompression processing program P12 determines successive segments of the same type as one compression unit. The compression/decompression processing program P12 assigns serial numbers, starting from the compression unit at the head, and stores values in the compression unit number column T70 and the pre-compression size column T73 in the content management table.

The compression/decompression processing program P12 obtains, from the memory 11, information on a block (segment) to which compression processing is determined to be applied. Compression processing is executed for a compression unit that includes the block to which compression processing is to be applied. The compression/decompression processing program P12 may determine what compression algorithm to use based on the segment type. The compression/decompression processing program P12 employs original data in a case where data to which compression is applied is larger than the original data.

The compression/decompression processing program P12 stores, for each compression unit, information on compression processing of the compression unit in the content management table T11. Specifically, the compression/decompression processing program P12 stores, for each compression unit, information on the compression unit in the post-compression application data offset column T71, the applied compression type column T72, the pre-compression size column T73, and the post-compression size column T74.

Next, the host 10 transmits data of this processing portion along with the content management table T11 that holds information up through this processing portion to the distributed storage system (the storage nodes 20 and 30) (Step S65).

Next, the data division/reconfiguration processing program P10 determines whether unanalyzed data is left (Step S66). In a case where there is data yet to be analyzed (NO in Step S66), the data division/reconfiguration processing program P10 repeats the processing from Step S61. In a case where analysis is finished for every piece of data (YES in Step S66), a stub file is created and stored in the memory (Step S67), at which point the data reduction/transmission processing is ended.

Figure 11:
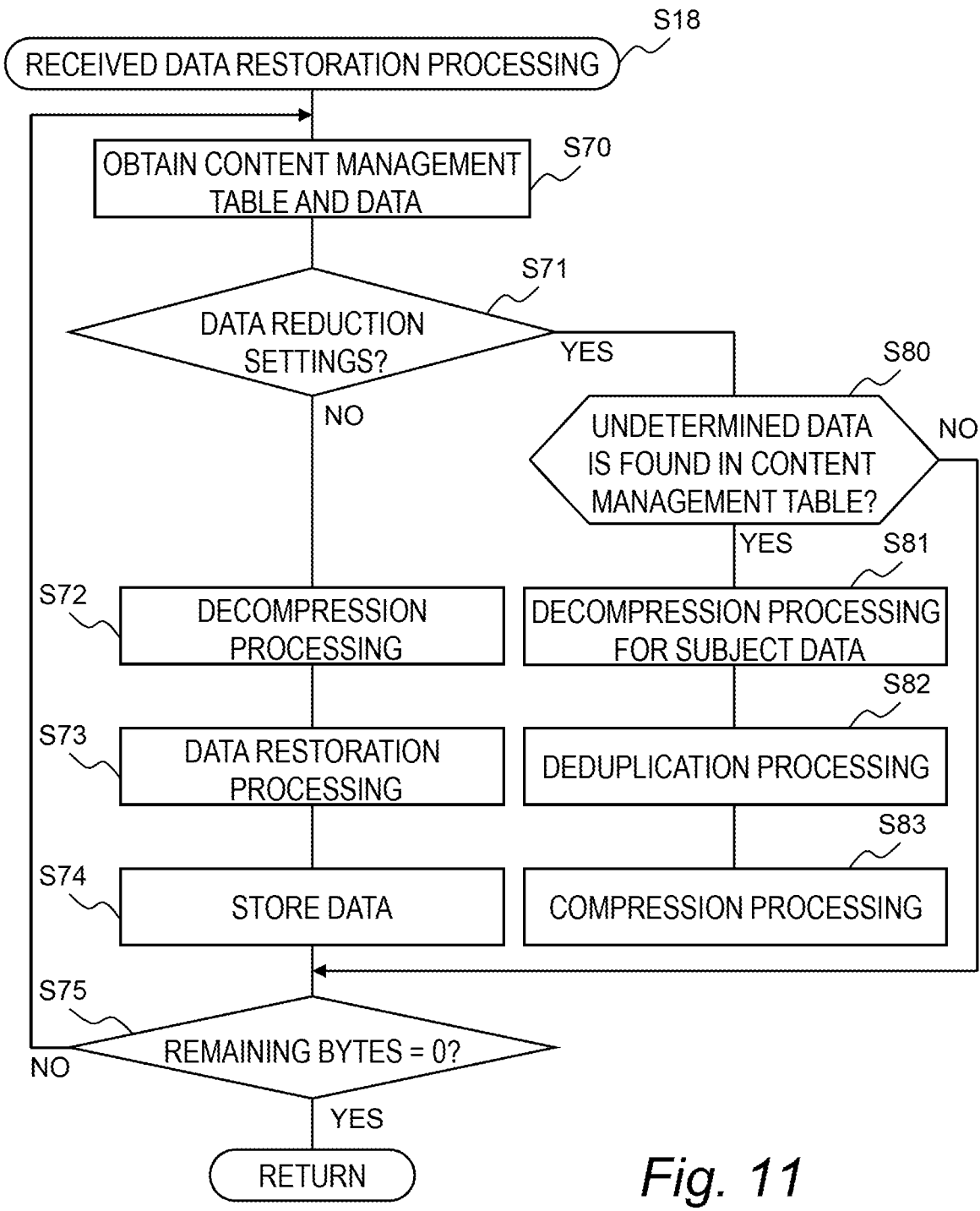
FIG. 11 is a flowchart of data restoration/storage processing according to the first embodiment.

FIG. 11 is a flowchart for illustrating details of the data restoration/storage processing in which data received by the distributed storage system is restored.

The data division/reconfiguration processing program P20 of the distributed storage system (the storage nodes 20 and 30) obtains the content management table T11 and data that are sent from the host 10 (Step S70). The content management table T11 received from the host 10 is stored in the memory 21 as the content management table T21.

The data division/reconfiguration processing program P20 determines whether data reduction settings are set in the distributed storage system (Step S71). In a case where it is determined as a result that settings for reducing data are not set (NO in Step S71), the data division/reconfiguration processing program P20 proceeds to Step S72. In a case where settings for reducing data are set (YES in Step S71), on the other hand, the data division/reconfiguration processing program P20 proceeds to Step S80. Whether data reduction is to be executed is set in the distributed storage system by the management system 50 in advance. Data reduction processing from Step S80 to Step S83 is described later in a second embodiment of this invention.

In Step S72, the compression/decompression processing program P22 uses the received content management table T21 to decompress received compressed data (Step S72). The data division/reconfiguration processing program P20 uses the received content management table T21 to obtain duplicate data from the storage nodes 20 and 30 and restore data (Step S73). The duplication information distributed management processing program P25 registers the unique ID of non-duplicate data to the duplication information list T22 at this point.

The data division/reconfiguration processing program P20 next stores the restored data in the distributed storage system (Step S74).

The data division/reconfiguration processing program P20 repeats Step S70 to Step S74 until every piece of data in the currently processed content is obtained.

Figure 12:
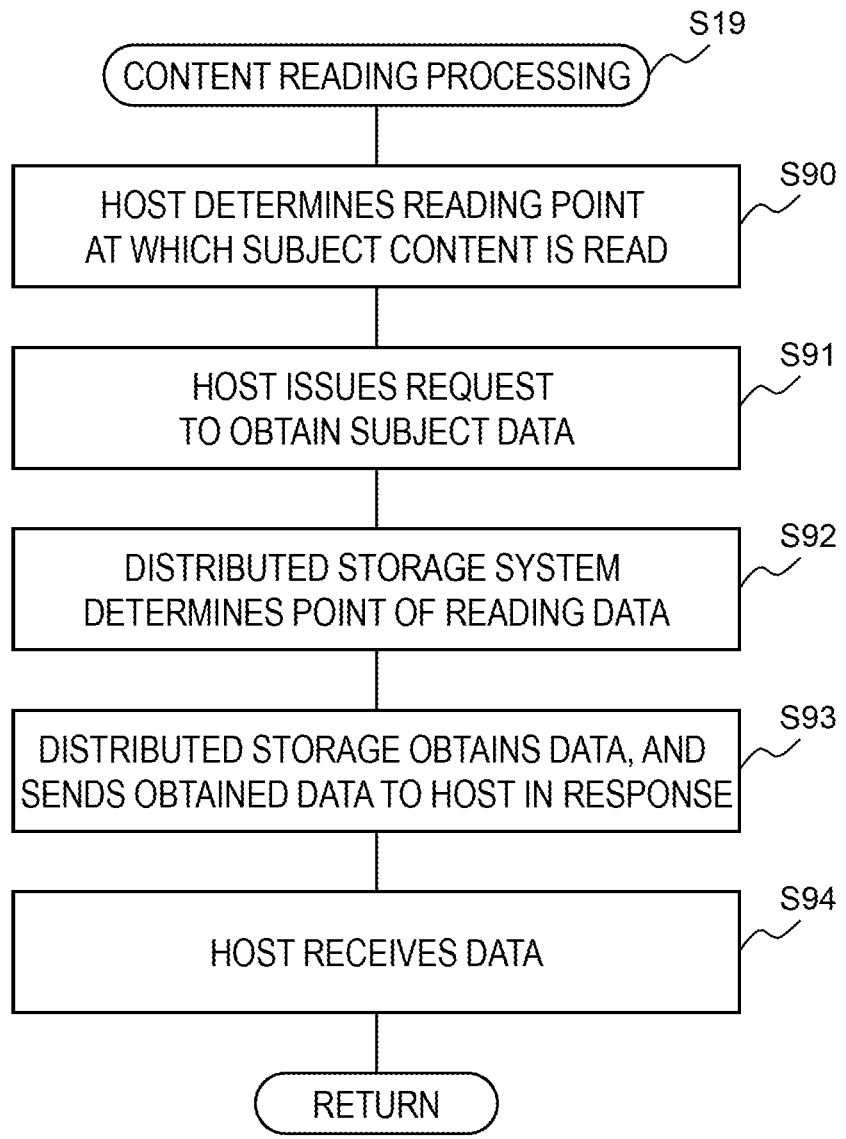
FIG. 12 is a flowchart of the content reading processing according to the first embodiment.

FIG. 12 is a flowchart of the content reading processing.

In a case where reading content that is stored in the distributed storage system, the host 10 determines a point at which the content is read (Step S90). Specifically, in a case where data to be read is stored in the storage device 12 (or memory 11) of the host 10, a location at which the data is stored in the storage device 12 (or in the memory 11) is determined as the reading point. In a case where data to be read is stored in the distributed storage system and is a stub file on the host 10, a location at which the data is stored in the storage node 20 or 30 is determined as the reading point.

The host 10 then requests the distributed storage to obtain the data to be read (Step S91).

The data division/reconfiguration processing program P20 of the storage node 20 receives the request from the host 10, and transfers the request to obtain the data to the content information distributed management processing program P26. The content information distributed management processing program P26 determines the storage location of the data to be read, and requests the data from the storage node 30 in which the data to be read is stored (Step S92).

The storage node 30 receives from the other storage node, namely, the storage node 20, the request for the data, reads the requested data out of the storage device 32, and sends the read data to the storage node 20, which has made the request, in response. The data division/reconfiguration processing program P20 of the storage node 20 merges the data received from the other storage node, namely, the storage node 30, and data read out of the storage device 12 (or the memory 11), and the reconfigured data to the host 10 in response (Step S93).

The host 10 receives the reconfigured data from the distributed storage system (Step S94), which completes the processing.

As described above, according to the first embodiment, data transfer performance is improved by reducing the amount of data transferred along a communication path between the host 10 and the distributed storage system (the storage nodes 20 and 30). In the data reduction, data for conducting duplication determination on the host 10 is sent from the distributed storage system to offload deduplication processing to the host 10. Global deduplication on a plurality of hosts 10 is accomplished in this manner. In addition, a processing bottleneck can be avoided on the distributed storage system side despite an increase in the number of hosts 10, thereby accomplishing high performance deduplication.

The host 10 calculates identification information (a unique ID) indicating the specifics of data to be written to the distributed storage system (the storage nodes 20 and 30), and obtains the duplication information list T12 by requesting information that indicates whether data associated with the calculated unique ID is stored (the duplication information list T12) from the storage nodes. The host 10 uses the obtained duplication information list T12 to determine whether the data to be written to the storage nodes has duplicate data, transmits deduplicated data, which no longer has the duplicate data, to the storage nodes, and requests the storage nodes to write this data. The host 10 uses at least one of: individual unique IDs; or a range of unique IDs, depending on how many unique IDs appear in succession, to request the duplication information list T12 from the storage system, which lessens the load on the path between the host 10 and the distributed storage system, and lessens the load within the distributed storage system.

In a case where the request concerns a plurality of successive unique IDs, the host 10 expresses the unique IDs for requesting the duplication information list T12 by a minimum value of unique IDs within the range of successive unique IDs and the number of unique IDs within the range of successive unique IDs. In a case where the request concerns a plurality of unique IDs discretely close to one another, the host 10 expresses the unique IDs for requesting the duplication information list T12 by a minimal value of unique IDs within the range of discretely close unique IDs and a difference between adjacent unique IDs. The data amount of unique IDs for requesting the duplication information list T12 can accordingly be reduced and the load on the path between the host 10 and the distributed storage system can be lessened.

The host 10 determines whether one of or both of: individual unique IDs; and a range of unique IDs is to be used in order to reduce the amount of data for representing unique IDs. The data amount of unique IDs for requesting the duplication information list T12 can accordingly be reduced and the load on the path between the host 10 and the distributed storage system can be lessened. The reception node 20 uses one of or both of 1) individual unique IDs and 2) a range of unique IDs, depending on how many unique IDs appear in succession, to request the duplication information list T12 from the other storage node, namely, the storage node 30. The data amount of unique IDs for requesting the duplication information list T12 can accordingly be reduced and the load within the distributed storage system can be lessened.

Second Embodiment

In the first embodiment, the performance of data transfer between the host 10 and the distributed storage is improved by reducing the data amount only on a communication path between the host 10 and the distributed storage. In the second embodiment, data is reduced not only on the communication path between the host 10 and the distributed storage, but also in the entire host 10 and the entire distributed storage. In the second embodiment, only configurations and processing different from those in the first embodiment are described, and descriptions on the same configurations and processing as those in the first embodiment are omitted.

Figure 13:
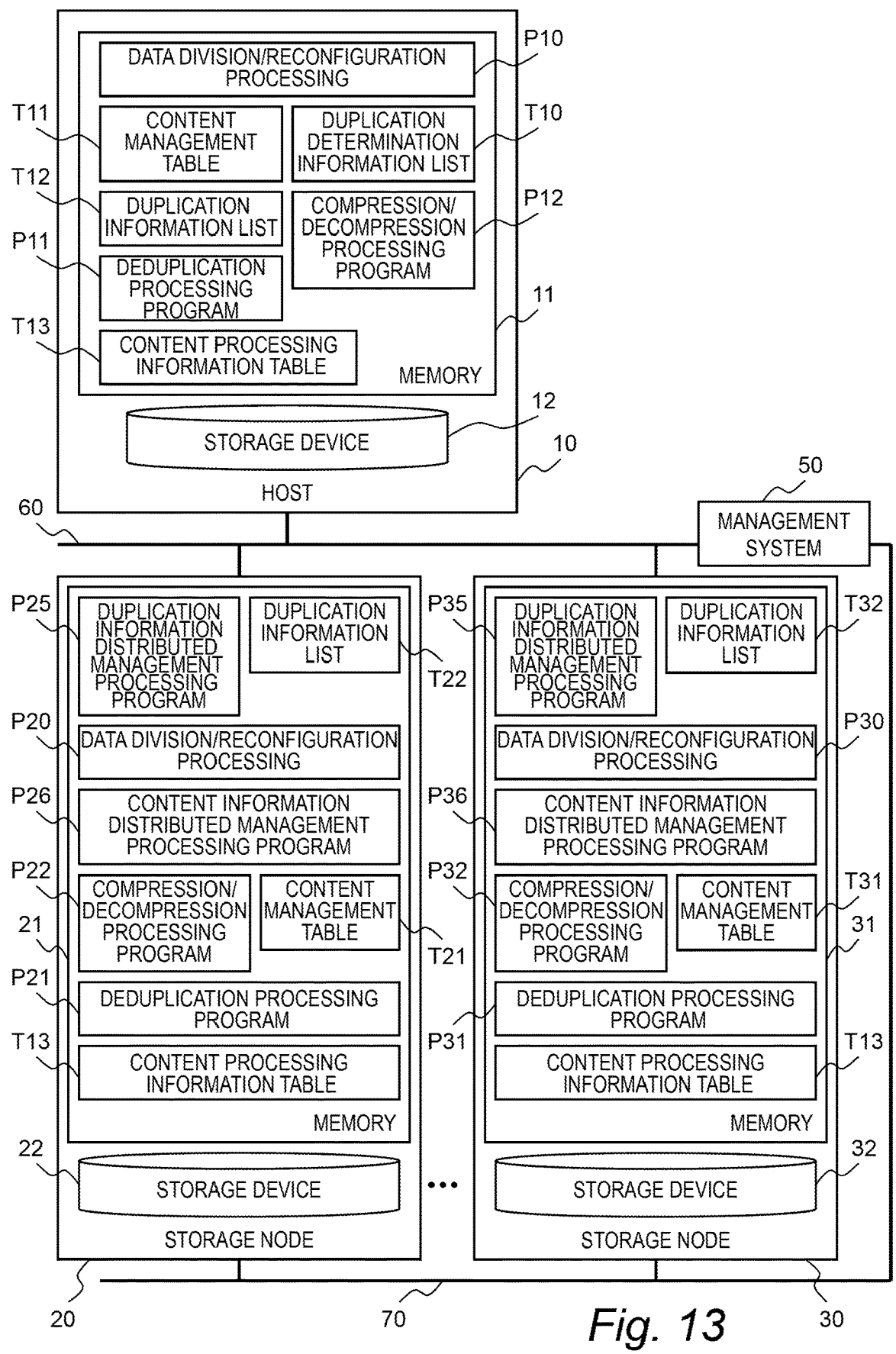
FIG. 13 is a diagram for illustrating the logical configuration of a computer system according to a second embodiment.

FIG. 13 is a diagram for illustrating the logical configuration of a computer system according to the second embodiment.

The computer system according to the second embodiment differs from the computer system according to the first embodiment in that the content processing information table T13 and deduplication processing programs P21, P31 are installed in the storage nodes 20 and 30.

The data division/reconfiguration processing program P20 cooperates with the duplication information distributed management processing program P25 and the content information distributed management processing program P26 to reconfigure data of content based on the content management table T11 transferred from the host 10, or based on content information configured by the content information distributed management processing program P26 from the content management tables T21 and T31. In a case where a duplicate information list obtaining request is received from the host 10, the data division/reconfiguration processing program P20 cooperates with the duplication information distributed management processing program P25 to obtain the requested duplication information.

The data division/reconfiguration processing program P20 also conducts duplication determination with the use of the content management table T11 transferred from the host 10, and removes duplicate data with the use of the unique ID of data determined as non-duplicate data.

Processing in the second embodiment is substantially the same as the processing described in the first embodiment with reference to FIG. 6 to FIG. 12. Differences from the first embodiment alone are therefore described.

In the second embodiment, the processing of transferring data from the host 10 to the distributed storage system (the storage nodes 20 and 30), which is illustrated in FIG. 6, does not include the execution of the data restoration/storage processing (Step S18). In other words, data transferred from the host 10 to the distributed storage system is stored directly in the storage node 20 or 30.

In the second embodiment, settings for reducing data are set by the management system 50, and the result of determination in Step S71 of the data restoration/storage processing illustrated in FIG. 11 is accordingly "YES". The data division/reconfiguration processing program P20 determines whether data for which duplication determination is not conducted yet is found on the content management list T11 (Step S80). In a case where duplication determination is finished for every piece of data to be processed (NO in Step S80), the data is stored as it is in the distributed storage system.

In a case where data for which duplication determination is not conducted yet is found among pieces of data to be processed, on the other hand, the data to be processed is decompressed (Step S81), and then deduplication processing (Step S82) and compression processing (Step S83) are executed. The storage node 20 executes the deduplication processing by obtaining duplication information that is managed by the other storage node, namely, the storage node 30. In a case where obtaining duplication information, the storage node 20 varies the way the duplication information list obtaining range is expressed depending on how massed or spaced the range of unique IDs is, as in Step S50 to Step S52 described in the first embodiment. The data is then stored in the distributed storage system.

In the content reading processing illustrated in FIG. 12, Step S92 and the subsequent steps in the second embodiment differs from those in the first embodiment.

In Step S92, the data division/reconfiguration processing program P20 of the storage node 20 receives the request from the host 10, and transfers the data obtaining request to the content information distributed management processing program P26. The content information distributed management processing program P26 refers to the content management list T21 to determine the storage location of the data to be read, and requests the data from the storage node 30 in which the data to be read is stored (Step S92).

The storage node 30 receives the request for the data from the other storage node, namely, the storage node 20, reads the requested data out of the storage device 32, and sends the read data to the storage node 20, which has made the request, in response. The data division/reconfiguration processing program P20 of the storage node 20 merges the data received from the other storage node, namely, the storage node 30, and data read out of the storage device 12 (or the memory 11), and sends the reconfigured data to the host 10 in response (Step S93).

The host 10 receives the reconfigured compressed data from the distributed storage system, and restores the received compressed data (Step S94), which completes the processing.

As described above, according to the second embodiment, the amount of data transferred along a communication path between the host 10 and the distributed storage system (the storage nodes 20 and 30) is reduced and the amount of data stored in the storage nodes 20 and 30 is further reduced. In the data reduction, data for conducting duplication determination on the host 10 is sent from the distributed storage system to offload deduplication processing to the host 10. Global deduplication on a plurality of hosts 10 is accomplished in this manner. In addition, a processing bottleneck can be avoided on the distributed storage system side despite an increase in the number of hosts 10, thereby accomplishing high performance deduplication.

The storage nodes 20 and 30 compress data requested by the host 10 to be written, and store the compressed data in the storage device 22 and 32. The capacity of the storage devices 22 and 32 can thus be utilized effectively.

The storage nodes 20 and 30 determine whether data requested by the host 10 to be written has a duplicate data, which is the same information as data already stored in one of the storage nodes, and stores deduplicated data, which no longer has the duplicated data, in the storage devices 22 and 32. The capacity of the storage devices 22 and 32 can thus be utilized effectively. This is particularly effective in a system that includes a large number of hosts 10.

Third Embodiment

A distributed storage system in a third embodiment of this invention uses the content processing information table T13 to execute data reduction processing for data transferred from the host 10 that is not reduced in data amount. Only differences from the first embodiment and the second embodiment in configuration and processing are described in the third embodiment, and descriptions on the same configurations and processing as those in the first embodiment and the second embodiment are omitted.

The storage nodes 20 and 30 in the third embodiment bear the data amount reduction function that is assigned to the host 10 in the embodiments described above. Specifically, the reception node 20 in the second embodiment performs the same operation as that of the host 10 to reduce the data amount, and acts in cooperation with the other storage node, namely, the storage node 30. In the data amount reduction, the way the duplication information list obtaining range is expressed is varied depending on how massed or spaced the range of unique IDs is, as in Step S50 to Step S52 described in the first embodiment.

As described above, according to the third embodiment, the amount of data transferred between nodes that make up the distributed storage system can be reduced, without giving the data amount reduction function to the host 10.

The reception node 20 uses one of or both of 1) individual unique IDs and 2) a range of unique IDs, depending on how many unique IDs appear in succession, to request the duplication information list T32 from the other storage node, namely, the storage node 30. The load between the storage nodes is accordingly lessened.

Fourth Embodiment

In the first embodiment to the third embodiment, deduplication and data amount reduction are conducted globally among nodes placed apart from one another and coupled to one another via a network. This idea is also applicable to a storage system equipped with a plurality of flash memories. Only differences from the first embodiment and the second embodiment in configuration and processing are described in a fourth embodiment of this invention, and descriptions on the same configurations and processing as those in the first embodiment and the second embodiment are omitted.

Figure 14:
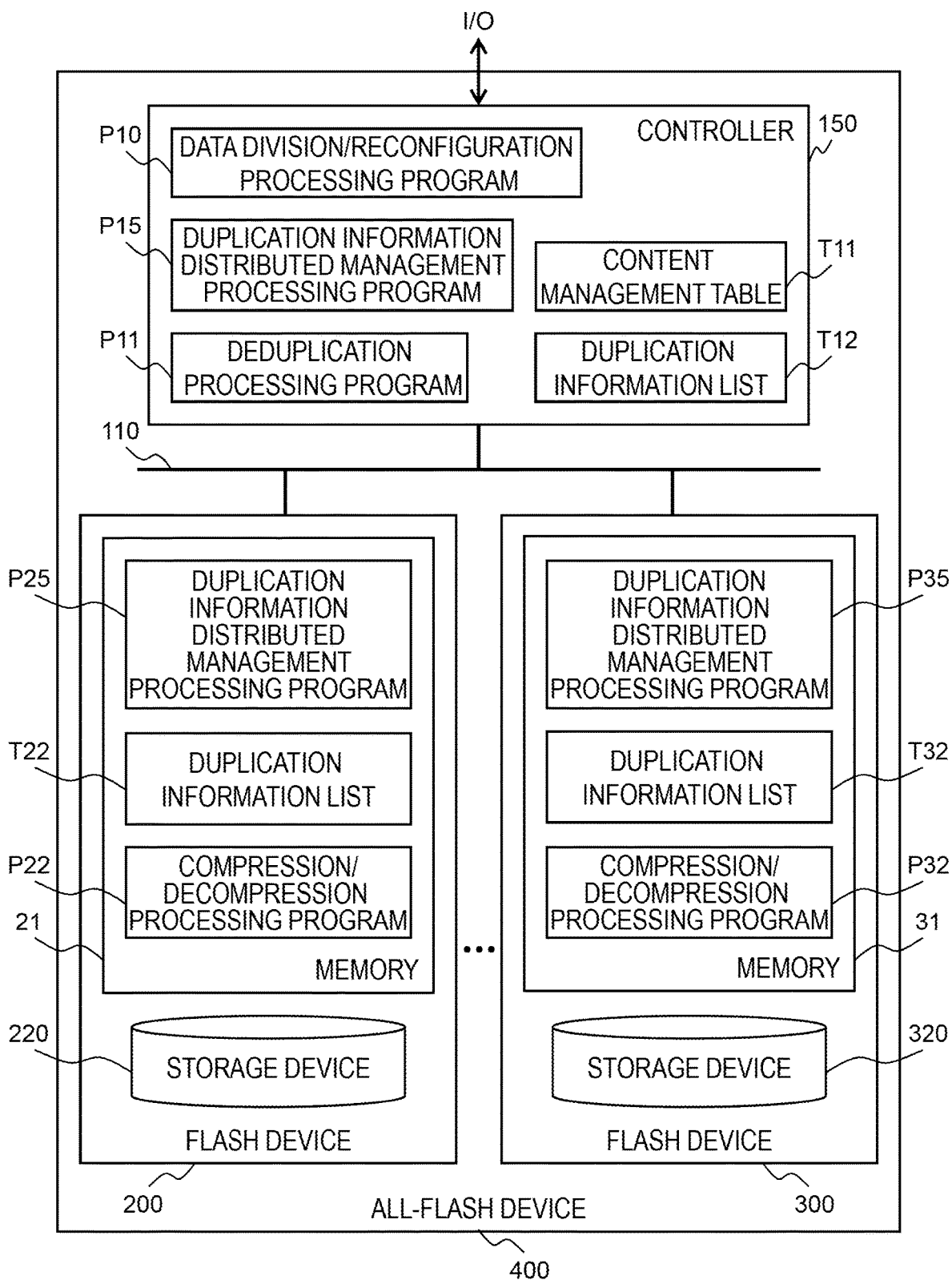
FIG. 14 is a diagram for illustrating an example of the configuration of an all-flash device according to a fourth embodiment.

FIG. 14 is a diagram for illustrating an example of the configuration of an all-flash device 400.

The all-flash device 400 includes a controller 150 and a plurality of flash devices 200 and 300.

The controller 150 transfers data input from the outside to the flash devices 200 and 300, and transfers data read out of the flash devices 200 and 300 to the outside. The controller 150 includes a processor (not shown), which executes a program, and a memory (not shown), which stores a program and data. A memory of the controller 150 stores the data division/reconfiguration processing program P10, the deduplication processing program P11, and a duplication information distributed management processing program P15. The memory further stores the content management table T11.

The memory 21 of the flash device 200 stores the compression/decompression processing program P22 and the duplication information distributed management processing program P25. The memory 21 further stores the duplication information list T22. The flash device 300 has the same configuration as that of the flash device 200, and a description on the configuration of the flash device 300 is therefore omitted.

The all-flash device 400 adopts distributed management in which the management of the duplication information lists T22 and T32 is distributed between the flash devices 200 and 300. The data division/reconfiguration processing program P10 of the controller 150 calculates, after receiving one or more pieces of data, the unique ID of each received piece of data, organizes the calculated unique IDs by unique ID ranges managed respectively by the flash devices 200 and 300, and requests the flash devices 200 and 300 to obtain duplication information lists. The flash devices 200 and 300 create lists within the requested ranges from the duplication information lists T22 and T32, and send the created lists in response. The data division/reconfiguration processing program P10 requests the deduplication processing program P11 to execute deduplication processing. The deduplication processing program P11 keeps duplicate data from being written in the flash devices 200 and 300, and rewrites the deduplication destination column T65 of the content management table T11. The deduplication processing program P11 registers the unique ID of a piece of non-duplicate data to the duplication information list T22 or T32 of one of the flash devices 200 and 300 that is tasked to manage this unique ID, and writes the piece of non-duplicate data in the storage device 220 or 320 of the tasked flash device 200 or 300.

The duplication information distributed management processing program P15 cooperates with the duplication information distributed management processing program P25 of the flash device 200 and the duplication information distributed management processing program P35 of the flash device 300 to manage the duplication information list T22 of the flash device 200 and the duplication information list T32 of the flash device 300.

As described above, according to the fourth embodiment, the efficiency of data reduction processing can be improved in a storage apparatus equipped with a plurality of flash memories.

The controller 150 calculates identification information (a unique ID) that indicates the specifics of data to be written in the storage device 220 or 320, requests information that indicates whether data associated with the calculated unique ID is stored (the duplication information list T12) from the flash devices 200 and 300 to obtain the duplication information list T12, uses the obtained duplication information list T12 to determine whether the data to be written in the flash device has duplicate data, transmits deduplicated data, which no longer has the duplicate data, to the flash device, and requests the flash device to write this data. The controller 150 uses one of or both of 1) individual unique IDs and 2) a range of unique IDs, depending on how many unique IDs appear in succession, to request the duplication information list T12 from the flash device, which lessens the load on the path between the controller 150 and the flash devices 200 and 300, and lessens the load within the storage apparatus (flash devices 200 and 300).

In a case where the request concerns a plurality of successive unique IDs, the controller 150 expresses the unique IDs for requesting the duplication information list T12 by a minimum value of unique IDs within the range of successive unique IDs and the number of unique IDs within the range of successive unique IDs. In a case where the request concerns a plurality of unique IDs discretely close to one another, the controller 150 expresses the unique IDs for requesting the duplication information list T12 by a minimal value of unique IDs within the range of discretely close unique IDs and a difference between adjacent unique IDs. The data amount of unique IDs for requesting the duplication information list T12 can accordingly be reduced and the load on the path between the controller 150 and the flash devices 200 and 300 can be lessened.

The controller 150 determines whether one of or both of 1) individual unique IDs and 2) a range of unique IDs is to be used in order to reduce the amount of data for representing unique IDs. The data amount of unique IDs for requesting the duplication information list T12 can accordingly be reduced and the load on the path between the controller 150 and the flash devices 200 and 300 can be lessened.

The flash device 200 receives the request from the controller 150, and uses one of or both of 1) individual unique IDs and 2) a range of unique IDs, depending on how many unique IDs appear in succession, to request the duplication information list T32 from the other flash device, namely, the flash device 300. The data amount of unique IDs for requesting the duplication information list T12 can accordingly be reduced and the load on the storage apparatus (flash devices 200 and 300) can be lessened.

The flash devices 200 and 300 compress data requested by the controller 150 to be written, and store the compressed data in the storage device 220 and 320. The capacity of the storage devices 220 and 320 can thus be utilized effectively.

The flash devices 200 and 300 determine whether data requested by the controller 150 to be written has duplicate data, which is the same information as data already stored in one of the storage node (flash devices 200 and 300), and store deduplicated data, which no longer has the duplicate data, in the storage devices 220 and 320. The capacity of the storage devices 220 and 320 can thus be utilized effectively.

This invention is not limited to the above-described embodiments but includes various modifications. The above-described embodiments are explained in details for better understanding of this invention and are not limited to those including all the configurations described above. A part of the configuration of one embodiment may be replaced with that of another embodiment; the configuration of one embodiment may be incorporated to the configuration of another embodiment. A part of the configuration of each embodiment may be added, deleted, or replaced by that of a different configuration.

The above-described configurations, functions, processing modules, and processing means, for all or a part of them, may be implemented by hardware: for example, by designing an integrated circuit, and may be implemented by software, which means that a processor interprets and executes programs providing the functions.

The information of programs, tables, and files to implement the functions may be stored in a storage device such as a memory, a hard disk drive, or an SSD (a Solid State Drive), or a storage medium such as an IC card, or an SD card.

The drawings illustrate control lines and information lines as considered necessary for explanation but do not illustrate all control lines or information lines in the products. It can be considered that almost of all components are actually interconnected.

What is claimed is:

1. A computer system, which has a deduplication function, the computer system comprising:
    at least one storage apparatus each having a storage device in which data is stored; and
    a computer processor programmed to request each of the at least one storage apparatus to write data, wherein the each of the at least one storage apparatus manages identification information indicating specifics of the stored data, wherein the computer is programmed to:
    calculate identification information indicating specifics of data to be written to one of the at least one storage apparatus;
    request information indicating whether data that is associated with the calculated identification information is stored to the one of the at least one storage apparatus to obtain the information indicating whether the data that is associated with the calculated identification information is stored;
    use the obtained information to determine whether the data to be written to the one of the at least one storage apparatus has duplicate data, which is the same data already stored in any one of the at least one storage apparatus; and
    transmit deduplicated data, which no longer has the duplicate data, to the one of the at least one storage apparatus, and request that the transmitted data be written, and
    wherein the one of the at least one storage apparatus is managed to store the data requested by the computer to be written, and
    wherein the computer is programmed to use at least one of individual pieces of identification information and a range of pieces of identification information, depending on how many pieces of identification information appear in succession, to request the information indicating whether the data that is associated with the calculated identification information is stored from the one of the at least one storage apparatus.

2. The computer system according to claim 1, wherein the computer is programmed to: express identification information for requesting the information by a minimum value of pieces of identification information within a range of the plurality of successive pieces of identification information and a number of pieces of identification information within the range of the plurality of successive pieces of identification information in a case where the request concerns a plurality of successive pieces of identification information; and express the identification information for requesting the information by a minimal value of pieces of identification information within a range of the plurality of discretely close pieces of identification information and a difference between adjacent pieces of identification information in a case where the request concerns a plurality of pieces of identification information discretely close to one another.

3. The computer system according to claim 1, wherein the computer is programmed to determine whether one of or both of individual pieces of identification information and a range of pieces of identification information is to be used in order to reduce an amount of data for representing the identification information.

4. The computer system according to claim 1, wherein the at least one storage apparatus includes a first storage apparatus and a second storage apparatus, wherein the computer is programmed to request the information indicating whether the data that is associated with the calculated identification information is stored from the first storage apparatus,
    wherein the first storage apparatus is managed to:
        request, in a case where the information indicating whether the data that is associated with the calculated identification information is stored is not managed by the first storage apparatus, the information indicating whether the data that is associated with the calculated identification information is stored from the second storage apparatus, which manages the information, to obtain the information indicating whether the data that is associated with the calculated identification information is stored; and
        send the requested information indicating whether the data that is associated with the calculated identification information is stored to the computer in response, and
    wherein the first storage apparatus is managed to use at least one of individual pieces of identification information or a range of pieces of identification information, depending on how many pieces of identification information appear in succession, to request the requested information indicating whether the data that is associated with the calculated identification information is stored from the second storage apparatus.

5. The computer system according to claim 1, wherein the one of the at least one storage apparatus is managed to compress data requested by the computer to be written, and to store the compressed data in the storage device.

6. The computer system according to claim 1, wherein the one of the at least one storage apparatus is managed to: determine whether data requested by the computer to be written has duplicate data, which has the same information as information of data already stored in any one of the at least one storage apparatus; and store deduplicated data, which no longer has the duplicate data, in the storage device.

7. The computer system according to claim 6, wherein the at least one storage apparatus includes a first storage apparatus and a second storage apparatus, wherein the first storage apparatus is managed to:
    calculate identification information indicating specifics of data that is requested by the computer to be written;
    request, in a case where the information indicating whether the data that is associated with the calculated identification information is stored is not managed by the first storage apparatus, the information indicating whether the data that is associated with the calculated identification information is stored from the second storage apparatus, which manages the information, to obtain the information indicating whether the data that is associated with the calculated identification information is stored;

use the information indicating whether the data that is associated with the calculated identification information is stored to deter mine whether the data to be written to one of the first storage apparatus and the second storage apparatus has duplicate data, which has the same information as information of data already stored in one of the first storage apparatus and the second storage apparatus; and store deduplicated data, which no longer has the duplicate data, in the storage device, and wherein the first storage apparatus is managed to use at least one of:

individual pieces of identification information; or a range of pieces of identification information, depending on how many pieces of identification information appear in succession, to request the requested information indicating whether the data that is associated with the calculated identification information is stored from the second storage apparatus.

8. A storage apparatus, comprising:

at least one storage device in which data is stored; and a processor programmed to manage input and output of data to and from the storage device, wherein the storage apparatus is coupled to a computer programmed to request the storage apparatus to write data, wherein the processor programmed to:

manage identification information indicating specifics of the stored data; calculate identification information indicating specifics of data to be written to one of the at least one storage device;

request information indicating whether the data that is associated with the calculated identification information is stored to the one of the at least one storage device to obtain the information indicating whether the data that is associated with the calculated identification information is stored;

use the obtained information to deter mine whether the data to be written to the one of the at least one storage device has duplicate data, which is the same data already stored in any one of the at least one storage device; and transmit deduplicated data, which no longer has the duplicate data, to the one of the at least one storage device, and request that the transmitted data be written, and wherein the one of the at least one storage device is programmed to store the data requested by the processor to be written, and wherein the processor is programmed to use at least one of individual pieces of identification information and a range of pieces of identification information, depending on how many pieces of identification information appear in succession, to request the information indicating whether the data that is associated with the calculated identification information is stored from the one of the at least one storage device.

9. The storage apparatus according to claim 8, wherein the processor is programmed to:

express identification information for requesting the information by a minimum value of pieces of identification information within a range of the plurality of successive pieces of identification information and a number of pieces of identification information within the range of the plurality of successive pieces of identification information in a case where the request concerns a plurality of successive pieces of identification information; and express the identification information for requesting the information by a minimal value of pieces of identification information within a range of the plurality of discretely close pieces of identification information and a difference between adjacent pieces of identification information in a case where the request concerns a plurality of pieces of identification information discretely close to one another.

10. The storage apparatus according to claim 8, wherein the processor is programmed to determine whether one of or both of:

individual pieces of identification information; and a range of pieces of identification information is to be used in order to reduce an amount of data for representing the identification information.

11. The storage apparatus according to claim 8, wherein the at least one storage device includes a first storage device and a second storage device, wherein the processor is programmed to request the information indicating whether the data that is associated with the calculated identification information is stored from the first storage device, wherein the first storage device is programmed to: request, in a case where the requested information indicating whether the data that is associated with the calculated identification information is stored is not managed by the first storage device, the information indicating whether the data that is associated with the calculated identification information is stored from the second storage device, which manages the information, to obtain the information indicating whether the data that is associated with the calculated identification information is stored; and send the requested information indicating whether the data that is associated with the calculated identification information is stored to the processor in response, and wherein the first storage device is programmed to use at least one of: individual pieces of identification information; or a range of pieces of identification information, depending on how many pieces of identification information appear in succession, to request the requested information indicating whether the data that is associated with the calculated identification information is stored from the second storage device.

12. The storage apparatus according to claim 8, wherein the one of the at least one storage device is programmed to compress data requested by the processor to be written, and to store the compressed data in the one of the at least one storage device.

13. The storage apparatus according to claim 8, wherein the one of the at least one storage device is programmed to: deter mine whether data requested by the processor to be written has duplicate data, which has the same information as information of data already stored in any one of the at least one storage apparatus; and store deduplicated data, which no longer has the duplicate data, in the one of the at least one storage device.

14. The storage apparatus according to claim 13, wherein the at least one storage device includes a first storage device and a second storage device, and wherein the first storage device is programmed to: calculate identification information indicating specifics of data that is requested by the processor to be written; request, in a case where the information indicating whether the data that is associated with the calculated identification information is stored is not managed by the first storage device, the information indicating whether the data that is associated with the calculated identification information is stored from the second storage device, which manages the information, to obtain the information indicating whether the data that is associated with the calculated identification information is stored; use the information indicating whether the data that is associated with the calculated identification information is stored to determine whether the data to be written to one of the first storage device and the second storage device has duplicate data, which has the same information as information of data already stored in one of the first storage device and the second storage device; and store deduplicated data, which no longer has the duplicate data, in any one of the first storage device and the second storage device.

15. A method of managing data in a computer system having a deduplication function, the computer system comprising: at least one storage apparatus each comprising a storage device in which data is stored; and a computer programmed to request the at least one storage apparatus to write data, the method of managing data including steps of:

managing, by each of the at least one storage apparatus, identification information indicating specifics of the data stored in the each of the at least one storage apparatus;

calculating, by the computer, identification information indicating specifics of data to be written to one of the at least one storage apparatus; requesting, by the computer, information indicating whether data that is associated with the calculated identification information is stored from the one of the at least one storage apparatus to obtain the information indicating whether the data that is associated with the calculated identification information is stored; using, by the computer, the obtained information to determine whether the data to be written to the one of the at least one storage apparatus has duplicate data, which is the same data already stored in any one of the at least one storage apparatus; transmitting, by the computer, deduplicated data, which no longer has the duplicate data, to the one of the at least one storage apparatus, and requesting that the transmitted data be written; and storing, by the one of the at least one storage apparatus, the data requested by the computer to be written, wherein the step of obtaining the information includes step of using, by the computer, at least one of individual pieces of identification information and a range of pieces of identification information, depending on how many pieces of calculated identification information appear in succession, to request the information indicating whether the data that is associated with the calculated identification information is stored from the one of the at least one storage apparatus.

* * * * *